(12) United States Patent
Higashino

(10) Patent No.: US 8,390,483 B2
(45) Date of Patent: Mar. 5, 2013

(54) CODING APPARATUS, CODING METHOD, RECORDING APPARATUS, RECORDING METHOD, DECODING APPARATUS, AND DECODING METHOD

(75) Inventor: Satoru Higashino, Tokyo (JP)

(73) Assignee: Sony Corporation, Tokyo (JP)

( * ) Notice: Subject to any disclaimer, the term of this patent is extended or adjusted under 35 U.S.C. 154(b) by 138 days.

(21) Appl. No.: 13/097,547

(22) Filed: Apr. 29, 2011

(65) Prior Publication Data

US 2011/0273972 A1 Nov. 10, 2011

(30) Foreign Application Priority Data

May 6, 2010 (JP) .................................. 2010-106592
Dec. 9, 2010 (JP) .................................. 2010-274549

(51) Int. Cl.
*H03M 7/00* (2006.01)
(52) U.S. Cl. .......................................... 341/59; 341/58
(58) Field of Classification Search ..................... 341/59, 341/58, 69, 68, 95; 369/59, 32, 124, 47, 369/48, 13, 54, 58, 100; 360/40, 41, 27, 360/28
See application file for complete search history.

(56) References Cited

U.S. PATENT DOCUMENTS

| 5,696,505 A | 12/1997 | Schouhamer Immink |
| 2007/0186840 A1 | 8/2007 | Dvorak |
| 2008/0080353 A1* | 4/2008 | Yamawaki .................... 369/100 |
| 2008/0205257 A1 | 8/2008 | Yamatsu et al. |

FOREIGN PATENT DOCUMENTS

| JP | 2008-176902 A | 7/2008 |
| JP | 2009-135144 A | 6/2009 |
| WO | WO 95/22802 | 8/1995 |

OTHER PUBLICATIONS

Schouhamer Immink, Kees A., "EFMPlus:The Coding Format of the Multimedia Compact Disc", IEEE Transaction on Consumer Electronics, Aug. 3, 1995, pp. 491-497, vol. 41, No. 3, The Netherlands.

* cited by examiner

*Primary Examiner* — Joseph Lauture
(74) *Attorney, Agent, or Firm* — Wolf, Greenfield & Sacks, P.C.

(57) ABSTRACT

A coding apparatus includes a transform table in which with regard to data words of m bits and code words of n bits where n and m are both integers and also n>m is established, $2^m$ pieces of code words selected to have a tendency that the number of symbols "1" is small among the $2^n$ pieces of code words of n bits are associated with the $2^m$ pieces of data words of m bits and a coding unit that encodes input data words of m bits on the basis of the transform table.

17 Claims, 19 Drawing Sheets

FIG. 3

| Data | Code | Occ |
|---|---|---|
| 0x0 | 1000000000100000000000100000 | 3 |
| 0x1 | 0100000000100000000000100000 | 3 |
| 0x2 | 0010000000100000000000100000 | 3 |
| 0x3 | 0001000000100000000000100000 | 3 |
| 0x4 | 0000100000100000000000100000 | 3 |
| 0x5 | 0000010000100000000000100000 | 3 |
| 0x6 | 0000001000100000000000100000 | 3 |
| 0x7 | 1000000000010000000000100000 | 3 |
| 0x8 | 0100000000010000000000100000 | 3 |
| 0x9 | 0010000000010000000000100000 | 3 |
| 0xa | 0001000000010000000000100000 | 3 |
| 0xb | 0000100000010000000000100000 | 3 |
| 0xc | 0000010000010000000000100000 | 3 |
| 0xd | 0000001000010000000000100000 | 3 |
| 0xe | 1000000000001000000000100000 | 3 |
| 0xf | 0100000000001000000000100000 | 3 |
| 0x10 | 0010000000001000000000100000 | 3 |
| 0x11 | 0001000000001000000000100000 | 3 |
| 0x12 | 0000100000001000000000100000 | 3 |
| 0x13 | 0000010000001000000000100000 | 3 |
| 0x14 | 0000001000001000000000100000 | 3 |
| 0x15 | 0100000000000100000000100000 | 3 |
| 0x16 | 0010000000000100000000100000 | 3 |
| 0x17 | 0001000000000100000000100000 | 3 |
| 0x18 | 0000100000000100000000100000 | 3 |
| 0x19 | 0000010000000100000000100000 | 3 |
| 0x1a | 0000001000000100000000100000 | 3 |
| 0x1b | 0100000000000010000000100000 | 3 |
| 0x1c | 0010000000000010000000100000 | 3 |
| 0x1d | 0001000000000010000000100000 | 3 |
| 0x1e | 0000100000000010000000100000 | 3 |
| 0x1f | 0000010000000010000000100000 | 3 |
| 0x20 | 0000001000000010000000100000 | 3 |
| 0x21 | 0010000000000001000000100000 | 3 |
| 0x22 | 0001000000000001000000100000 | 3 |
| 0x23 | 0000100000000001000000100000 | 3 |
| 0x24 | 0000010000000001000000100000 | 3 |
| 0x25 | 0000001000000001000000100000 | 3 |
| 0x26 | 0001000000000000100000100000 | 3 |
| 0x27 | 0000100000000000100000100000 | 3 |
| 0x28 | 0000010000000000100000100000 | 3 |
| 0x29 | 0000001000000000100000100000 | 3 |
| 0x2a | 0000100000000000010000100000 | 3 |
| 0x2b | 0000010000000000010000100000 | 3 |
| 0x2c | 0000001000000000010000100000 | 3 |
| 0x2d | 0000010000000000001000100000 | 3 |
| 0x2e | 0000001000000000001000100000 | 3 |
| 0x2f | 0000001000000000000100100000 | 3 |
| 0x30 | 1000000000100000000000010000 | 3 |

FIG. 4

| | | |
|---|---|---|
| 0x31 | 0100000000010000000000010000 ABBREVIATED | 3 |
| 0xffcf | 0100100001000010010001001 | 8 |
| 0xffd0 | 1000010001000010010001001 | 8 |
| 0xffd1 | 0100010001000010010001001 | 8 |
| 0xffd2 | 0010010001000010010001001 | 8 |
| 0xffd3 | 1000001001000010010001001 | 8 |
| 0xffd4 | 0100001001000010010001001 | 8 |
| 0xffd5 | 0010001001000010010001001 | 8 |
| 0xffd6 | 0001001001000010010001001 | 8 |
| 0xffd7 | 1001000001000010010001001 | 8 |
| 0xffd8 | 1000100001000010010001001 | 8 |
| 0xffd9 | 0100100001000010010001001 | 8 |
| 0xffda | 1000010001000010010001001 | 8 |
| 0xffdb | 0100010001000010010001001 | 8 |
| 0xffdc | 0010010001000010010001001 | 8 |
| 0xffdd | 1000001001000010010001001 | 8 |
| 0xffde | 0100001001000010010001001 | 8 |
| 0xffdf | 0010001001000010010001001 | 8 |
| 0xffe0 | 0001001001000010010001001 | 8 |
| 0xffe1 | 1000000100100010010001001 | 8 |
| 0xffe2 | 0100000100100010010001001 | 8 |
| 0xffe3 | 0010000100100010010001001 | 8 |
| 0xffe4 | 0001000100100010010001001 | 8 |
| 0xffe5 | 0000100100100010010001001 | 8 |
| 0xffe6 | 1001000001001001000010010001 | 8 |
| 0xffe7 | 1000100001001001000010010001 | 8 |
| 0xffe8 | 0100100001001001000010010001 | 8 |
| 0xffe9 | 1000010001001001000010010001 | 8 |
| 0xffea | 0100010001001001000010010001 | 8 |
| 0xffeb | 0010010001001001000010010001 | 8 |
| 0xffec | 1000001001001001000010010001 | 8 |
| 0xffed | 0100001001001001000010010001 | 8 |
| 0xffee | 0010001001001001000010010001 | 8 |
| 0xffef | 0001001001001001000010010001 | 8 |
| 0xfff0 | 1000000100100100010010001 | 8 |
| 0xfff1 | 0100000100100100010010001 | 8 |
| 0xfff2 | 0010000100100100010010001 | 8 |
| 0xfff3 | 0001000100100100010010001 | 8 |
| 0xfff4 | 0000100100100100010010001 | 8 |
| 0xfff5 | 1000000010010010010010001 | 8 |
| 0xfff6 | 0100000010010010010010001 | 8 |
| 0xfff7 | 0010000010010010010010001 | 8 |
| 0xfff8 | 0001000010010010010010001 | 8 |
| 0xfff9 | 0000100010010010010010001 | 8 |
| 0xfffa | 0000010010010010010010001 | 8 |
| 0xfffb | 1001001001000000010010001 | 8 |
| 0xfffc | 1001001000100000010010001 | 8 |
| 0xfffd | 1001000100100000010010001 | 8 |
| 0xfffe | 1000100100100000010010001 | 8 |
| 0xffff | 0100100100100000010010001 | 8 |

FIG. 14

Code Table (Occurrence descendant order 65536 in 69934)

| Data | Code | Occ | beg_z | end_z | beg2_z | end2_z |
|---|---|---|---|---|---|---|
| 0x0 | 000000000010000000000001000000000 | 2 | 10 | 9 | -1 | -1 |
| 0x1 | 100000000010000000000001000000000 | 3 | 0 | 9 | 9 | -1 |
| 0x2 | 010000000010000000000001000000000 | 3 | 1 | 9 | -1 | -1 |
| 0x3 | 001000000010000000000001000000000 | 3 | 2 | 9 | -1 | -1 |
| 0x4 | 000100000010000000000001000000000 | 3 | 3 | 9 | -1 | -1 |
| 0x5 | 000010000010000000000001000000000 | 3 | 4 | 9 | -1 | -1 |
| 0x6 | 000001000010000000000001000000000 | 3 | 5 | 9 | -1 | -1 |
| 0x7 | 000000100010000000000001000000000 | 3 | 6 | 9 | -1 | -1 |
| 0x8 | 100000000001000000000001000000000 | 3 | 0 | 9 | 10 | -1 |
| 0x9 | 010000000001000000000001000000000 | 3 | 1 | 9 | -1 | -1 |
| 0xa | 001000000001000000000001000000000 | 3 | 2 | 9 | -1 | -1 |
| 0xb | 000100000001000000000001000000000 | 3 | 3 | 9 | -1 | -1 |
| 0xc | 000010000001000000000001000000000 | 3 | 4 | 9 | -1 | -1 |
| 0xd | 000001000001000000000001000000000 | 3 | 5 | 9 | -1 | -1 |
| 0xe | 000000100001000000000001000000000 | 3 | 6 | 9 | -1 | -1 |
| 0xf | 000000010001000000000001000000000 | 3 | 7 | 9 | -1 | -1 |
| 0x10 | 100000000000100000000001000000000 | 3 | 0 | 9 | 11 | -1 |
| 0x11 | 010000000000100000000001000000000 | 3 | 1 | 9 | -1 | -1 |
| 0x12 | 001000000000100000000001000000000 | 3 | 2 | 9 | -1 | -1 |
| 0x13 | 000100000000100000000001000000000 | 3 | 3 | 9 | -1 | -1 |
| 0x14 | 000010000000100000000001000000000 | 3 | 4 | 9 | -1 | -1 |
| 0x15 | 000001000000100000000001000000000 | 3 | 5 | 9 | -1 | -1 |
| 0x16 | 000000100000100000000001000000000 | 3 | 6 | 9 | -1 | -1 |
| 0x17 | 000000010000100000000001000000000 | 3 | 7 | 9 | -1 | -1 |
| 0x18 | 000000001000100000000001000000000 | 3 | 8 | 9 | -1 | -1 |
| 0x19 | 010000000000010000000001000000000 | 3 | 1 | 9 | -1 | -1 |
| 0x1a | 001000000000010000000001000000000 | 3 | 2 | 9 | -1 | -1 |
| 0x1b | 000100000000010000000001000000000 | 3 | 3 | 9 | -1 | -1 |
| 0x1c | 000010000000010000000001000000000 | 3 | 4 | 9 | -1 | -1 |
| 0x1d | 000001000000010000000001000000000 | 3 | 5 | 9 | -1 | -1 |
| 0x1e | 000000100000010000000001000000000 | 3 | 6 | 9 | -1 | -1 |
| 0x1f | 000000010000010000000001000000000 | 3 | 7 | 9 | -1 | -1 |
| 0x20 | 000000001000010000000001000000000 | 3 | 8 | 9 | -1 | -1 |
| 0x21 | 000000000100010000000001000000000 | 3 | 9 | 9 | -1 | -1 |
| 0x22 | 010000000000001000000001000000000 | 3 | 1 | 9 | -1 | -1 |
| 0x23 | 001000000000001000000001000000000 | 3 | 2 | 9 | -1 | -1 |
| 0x24 | 000100000000001000000001000000000 | 3 | 3 | 9 | -1 | -1 |
| 0x25 | 000010000000001000000001000000000 | 3 | 4 | 9 | -1 | -1 |
| 0x26 | 000001000000001000000001000000000 | 3 | 5 | 9 | -1 | -1 |
| 0x27 | 000000100000001000000001000000000 | 3 | 6 | 9 | -1 | -1 |
| 0x28 | 000000010000001000000001000000000 | 3 | 7 | 9 | -1 | -1 |
| 0x29 | 000000001000001000000001000000000 | 3 | 8 | 9 | -1 | -1 |
| 0x2a | 000000000100001000000001000000000 | 3 | 9 | 9 | -1 | -1 |
| 0x2b | 000000000010001000000001000000000 | 3 | 10 | 9 | -1 | -1 |
| 0x2c | 010000000000000100000001000000000 | 3 | 1 | 9 | -1 | -1 |
| 0x2d | 001000000000000100000001000000000 | 3 | 2 | 9 | -1 | -1 |
| 0x2e | 000100000000000100000001000000000 | 3 | 3 | 9 | -1 | -1 |
| 0x2f | 000010000000000100000001000000000 | 3 | 4 | 9 | -1 | -1 |
| 0x30 | 000001000000000100000001000000000 | 3 | 5 | 9 | -1 | -1 |
| 0x31 | 000000100000000100000001000000000 | 3 | 6 | 9 | -1 | -1 |
| ... | ABBREVIATED | | | | | |
| 0xffcf | 100001000100001000001000000100001 | 7 | 0 | 0 | 5 | 4 |
| 0xffd0 | 010001000100001000001000000100001 | 7 | 1 | 0 | -1 | 4 |
| 0xffd1 | 001001000100001000001000000100001 | 7 | 2 | 0 | -1 | 4 |
| 0xffd2 | 100010001000001000001000000100001 | 7 | 0 | 0 | 3 | 4 |
| 0xffd3 | 100001000100001000001000000100001 | 7 | 0 | 0 | 3 | 4 |
| 0xffd4 | 100001000100001000001000000100001 | 7 | 0 | 0 | 4 | 4 |
| 0xffd5 | 010001000100001000001000000100001 | 7 | 1 | 0 | -1 | 4 |
| 0xffd6 | 100010001000001000001000000100001 | 7 | 0 | 0 | 3 | 4 |
| 0xffd7 | 100010001000001000001000000100001 | 7 | 0 | 0 | 4 | 4 |
| 0xffd8 | 010001000100001000001000000100001 | 7 | 1 | 0 | -1 | 4 |
| 0xffd9 | 100001000100001000001000000100001 | 7 | 0 | 0 | 5 | 4 |
| 0xffda | 010001000100001000001000000100001 | 7 | 1 | 0 | -1 | 4 |
| 0xffdb | 001001000100001000001000000100001 | 7 | 2 | 0 | -1 | 4 |
| 0xffdc | 100010000100001000001000000100001 | 7 | 0 | 0 | 3 | 4 |
| 0xffdd | 100010000100001000001000000100001 | 7 | 0 | 0 | 4 | 4 |
| 0xffde | 010001000010001000001000000100001 | 7 | 1 | 0 | -1 | 4 |

FIG. 15

| | | | | | | |
|---|---|---|---|---|---|---|
| 0xffdf | 10000010000100010000010000000100001 | 7 | 0 | 0 | 5 | 4 |
| 0xffe0 | 01000010000100010000010000000100001 | 7 | 1 | 0 | -1 | 4 |
| 0xffe1 | 00100010000100010000010000000100001 | 7 | 2 | 0 | -1 | 4 |
| 0xffe2 | 10000001000100010000010000000100001 | 7 | 0 | 0 | 6 | 4 |
| 0xffe3 | 01000010000100010000010000000100001 | 7 | 1 | 0 | -1 | 4 |
| 0xffe4 | 00100010000100010000010000000100001 | 7 | 2 | 0 | -1 | 4 |
| 0xffe5 | 00010010000100010000010000000100001 | 7 | 3 | 0 | -1 | 4 |
| 0xffe6 | 10001000100000010000010000000100001 | 7 | 0 | 0 | 3 | 4 |
| 0xffe7 | 10001000100000010000010000000100001 | 7 | 0 | 0 | 3 | 4 |
| 0xffe8 | 10000100010000010000010000000100001 | 7 | 0 | 0 | 4 | 4 |
| 0xffe9 | 01000100010000010000010000000100001 | 7 | 1 | 0 | -1 | 4 |
| 0xffea | 10001000010000010000010000000100001 | 7 | 0 | 0 | 3 | 4 |
| 0xffeb | 10000100010000010000010000000100001 | 7 | 0 | 0 | 4 | 4 |
| 0xffec | 01000100010000010000010000000100001 | 7 | 1 | 0 | -1 | 4 |
| 0xffed | 10000010010000010000010000000100001 | 7 | 0 | 0 | 5 | 4 |
| 0xffee | 01000010010000010000010000000100001 | 7 | 1 | 0 | -1 | 4 |
| 0xffef | 00100010010000010000010000000100001 | 7 | 2 | 0 | -1 | 4 |
| 0xfff0 | 10001000001000010000010000000100001 | 7 | 0 | 0 | 3 | 4 |
| 0xfff1 | 10000100001000010000010000000100001 | 7 | 0 | 0 | 4 | 4 |
| 0xfff2 | 01000100001000010000010000000100001 | 7 | 1 | 0 | -1 | 4 |
| 0xfff3 | 10000010001000010000010000000100001 | 7 | 0 | 0 | 5 | 4 |
| 0xfff4 | 01000010001000010000010000000100001 | 7 | 1 | 0 | -1 | 4 |
| 0xfff5 | 00100010001000010000010000000100001 | 7 | 2 | 0 | -1 | 4 |
| 0xfff6 | 10000001001000010000010000000100001 | 7 | 0 | 0 | 6 | 4 |
| 0xfff7 | 01000001001000010000010000000100001 | 7 | 1 | 0 | -1 | 4 |
| 0xfff8 | 00100001001000010000010000000100001 | 7 | 2 | 0 | -1 | 4 |
| 0xfff9 | 00010001001000010000010000000100001 | 7 | 3 | 0 | -1 | 4 |
| 0xfffa | 10001000000100010000010000000100001 | 7 | 0 | 0 | 3 | 4 |
| 0xfffb | 10000100000100010000010000000100001 | 7 | 0 | 0 | 4 | 4 |
| 0xfffc | 01000100000100010000010000000100001 | 7 | 1 | 0 | -1 | 4 |
| 0xfffd | 10000010000100010000010000000100001 | 7 | 0 | 0 | 5 | 4 |
| 0xfffe | 01000010000100010000010000000100001 | 7 | 1 | 0 | -1 | 4 |
| 0xffff | 00100010000100010000010000000100001 | 7 | 2 | 0 | -1 | 4 |

CODING APPARATUS, CODING METHOD, RECORDING APPARATUS, RECORDING METHOD, DECODING APPARATUS, AND DECODING METHOD

BACKGROUND OF THE INVENTION

1. Field of the Invention

The present invention relates to a coding apparatus that transforms an m-bit data word into an n-bit code word and performs a coding on the above-mentioned m-bit data word and a method therefor. Also, the invention relates to a recording apparatus that records a recording code sequence obtained through the coding described above and a method therefor. Furthermore, the invention relates to a decoding apparatus that decodes a code sequence and a method therefor.

2. Description of the Related Art

As an optical recording medium where recording/reproduction of a signal is performed though irradiation of light, for example, so-called optical discs such as a CD (Compact Disc), a DVD (Digital Versatile Disc), and a BD (Blu-ray Disc: registered trademark) are widely spread.

In these currently prevalent optical discs, a mark edge recording is carried out in which a recording code is defined by NRZI (Non Return to Zero Inverting) and transformed into an NRZ (Non Return to Zero) code at the time of recording to be then recorded.

Also, for the optical discs, a low frequency content of the recording code is desirably used in connection with a situation that a tracking error signal is obtained from a group, a pit, or the like. That is, this is because a tracking servo channel is located to be lower than a signal channel of the recording code, but when the recording code has a large amount of the low frequency components, the component of the recording code overlaps the tracking error signal, which may degrade a tracking servo characteristic.

In view of the above, in the optical discs in related art, suppression on the low frequency components of the recording code is realized by performing a control so as to lower an absolute value of a DSV (Digital Sum Value) of a recording NRZ code sequence.

For example, an EFM modulation code is used in the CD, where a coding method is adopted in which predetermined merging bits composed of 3 bits that satisfy a limit of a minimum runlength of d=2 and also causes the absolute value of the DSV of the code sequence to be small are selected and inserted between a 14-bit code word and the next code word.

Also, in the DVD, the following DSV control is carried out. By using a modulation code called EFM Plus, with regard to a certain data word, a code word with which the absolute value of the DSV of the code sequence becomes small is selected from a main table and a substitute table to be coded. This modulation code is disclosed, for example, "EFMPlus: THE CODING FORMAT OF THE MULTIMEDIA COMPACT DISC" by Kees A. Schouhamer Immink, IEEE Transaction on Consumer Electronics, Vol. 41, Issue 3, Aug. 1995 or International Publication No. 95/22802.

Also, a modulation code called 17PP is used in the BD. DC control bits are periodically defined in a recording data format of the BD, and a coding is carried out after the DC control bit of "0" or "1" with which the absolute value of the DSV of the code sequence decreases is selected.

Also, for example, for a recording modulation coding method for a magnetic disc recording medium, (2,7) RLL is also used. This (2,7) RLL satisfies runlength constraints of d=2 and also k=7, in which a coding using a variable length table is carried out. The coding rate becomes ½.

To be more specific, in (2,7) RLL, the coding on input data is carried out on the basis of the following rule.

Input data→Code
11→1000
10→0100
000→000100
010→100100
011→001000
0011→00001000
0010→00100100

According to such transform rules of (2,7) RLL, for example, input data composed of "110110011" is transformed into a code sequence of "100000100000001000" on the basis of "11"→"1000", "011"→"001000", and "0011"→"00001000".

On the other hand, in contrast with the currently prevalent optical discs such as the CD, the DVD, and the BD, the applicant of the present invention previously proposes a so-called bulk recording-type (simply also referred to as bulk-type) optical disc as a next generation optical disc as described, for example, in Japanese Unexamined Patent Application Publication No. 2008-135144 or Japanese Unexamined Patent Application Publication No. 2008-176902.

Here, the bulk recording refers to a technology for realizing a larger recording capacity by irradiating an optical recording medium (a bulk-type recording medium 100) having at least a cover layer 101 and a bulk layer (recording layer) 102 with laser light while sequentially changing a focal position and performing a multilayer recording in the bulk layer 102 as illustrated, for example, in FIG. 18.

With regard to the above-mentioned bulk recording, Japanese Unexamined Patent Application Publication No. 2008-135144 described above discloses a recording technology that is so-called micro hologram system. According to the micro hologram system, for a recording material of the bulk layer 102, so-called hologram recording material is used. For the hologram recording material, for example, light-cured type photopolymer or the like is widely used.

The micro hologram system is roughly classified into a positive-type micro hologram system and a negative-type micro hologram system.

The positive-type micro hologram system relates to a technique for gathering two opposed light fluxes (a light flux A and a light flux B) at a same position to form a minute interference pattern (hologram) and setting this as a recording mark.

Also, on the basis of the opposite point of view from the positive-type micro hologram system, the negative-type micro hologram system relates to a technique for deleting a previously formed interference pattern through laser light irradiation and setting the deleted part as a recording mark. In this negative-type micro hologram system a processing of forming the interference pattern in the bulk layer is performed in advance as an initialization processing.

Also, the applicant of the present invention also proposes, for example, a recording method of forming void (porosity, hole) as a recording mark which is disclosed in Japanese Unexamined Patent Application Publication No. 2008-176902 as a method for the bulk recording that is different from the micro hologram system.

A void recording system relates to a method of irradiating the bulk layer 102 made of a recording material such as light-cured type photopolymer, for example, with laser light at relatively high power and recording the void in the bulk layer 102. As described in Japanese Unexamined Patent Application Publication No. 2008-176902, the thus formed void section becomes a section having a different refractive index from other sections in the bulk layer 102, and a reflection factor is increased at a border section thereof. Therefore, the above-mentioned void section functions as the recording mark, and information recording based on the formation of the void section is accordingly realized.

According to the above-mentioned void recording system, the hologram is not formed, and it suffices that the light irradiation is carried out from one side at the time of the recording. That is, in the case of the above-mentioned positive-type micro hologram system, it suffices that the recording mark is not formed by gathering the two light fluxes at the same position.

Also, in comparison with the negative-type micro hologram system, a merit exists that the initialization processing is not carried out.

It should be noted that Japanese Unexamined Patent Application Publication No. 2008-176902 illustrates an example in which precure light irradiation before recording is performed when the void recording is carried out, but the void recording can be carried out even when such precure light irradiation is omitted.

Incidentally, with regard to the bulk recording-type (simply also referred to as bulk-type) optical disc recording medium for which the above-mentioned various recording techniques are proposed, a recording layer (bulk layer) of the above-mentioned bulk-type optical disc recording medium does not have an explicit multilayer structure in a sense, for example, that a plurality of reflection films are formed. That is, the bulk layer 102 is not provided with a reflection film and a guide groove for each recording layer which are provided to a normal multilayer disc.

Therefore, in the case of the structure of the bulk-type recording medium 100 illustrated in the aforementioned FIG. 18 without change, at the time of recording when the mark is not formed, focus servo and tracking servo are not carried out.

For this reason, in the actuality, the bulk-type recording medium 100 is provided with a reflection surface (reference surface) that becomes a reference having a guide groove as illustrated in the following FIG. 19.

To be more specific, for example, a guide groove (position guiding element) is formed on a lower surface side of the cover layer 101 in a spiral or concentric manner through formation of a pit or a groove where a selective reflection film 103 is formed. Then, the bulk layer 102 is layered via an adhesive material such as UV curing resin, for example, functioning as an intermediate layer 104 in the drawing on a lower layer side of the cover layer 101 on which the selective reflection film 103 is thus formed.

Here, through the above-mentioned formation of the guide groove by the pit or the groove, for example, recording of absolute positional information (address information) such as radial positional information or rotation angle information is carried out. In the following description, the surface on which the guide groove is formed and the recording of the absolute positional information is carried out (in this case, the formation surface of the selective reflection film 103 described above) is referred to as "reference surface Ref".

On the basis of the above-mentioned medium structure, the bulk-type recording medium 100 is irradiated with not only laser light for recording (or reproducing) the mark as illustrated in the drawing (hereinafter, which will be also referred to as recording reproduction laser light or simply recording reproduction light) but also laser light for servo (simply also referred to as servo light) as laser light for positional control via respective common objective lenses.

At this time, if the above-mentioned servo laser light reaches the bulk layer 102, an adverse affect may occur in the mark recording in the bulk layer 102. For this reason, up to now, in the bulk recording system, while laser light having a different waveband from the recording reproduction light is used as the above-mentioned servo laser light, the selective reflection film 103 having a wavelength selectivity in which the servo laser light reflects and the recording reproduction laser light transmits is provided as the reflection film formed on the reference surface Ref.

On the basis of the above-mentioned assumption, a description will be given of an operation at the time of the mark recording on the bulk-type recording medium 100. First, when the multilayer recording is carried out on the bulk layer 102 the guide groove or the reflection film is not formed, at which positions are previously set as layer positions for recording the mark in a depth direction in the bulk layer 102. In the drawing, a case is exemplified in which total five information recording layer positions including a first information recording layer position L1 to a fifth information recording layer position L5 are set as the layer positions where the mark is formed in the bulk layer 102 (mark formation layer position: also referred to as information recording layer position). As illustrated in the drawing, the first information recording layer position L1 is the information recording layer position L set on the uppermost layer, and subsequently, in the order of L2→L3→L4→L5, the information recording layer position L is set on the lower layer side.

At the time of recording when the mark is not formed, the focus servo and the tracking servo are not carried out while the respective layer positions in the bulk layer 102 are set as targets on the basis of the reflection light of the recording reproduction laser light. Therefore, the focus servo control and the tracking servo control on the objective lens at the time of recording are carried out on the basis of the reflection light of the servo laser light so that a spot position of the servo laser light follows the guide groove on the reference surface Ref.

It should be noted however that the above-mentioned recording reproduction laser light is caused to reach the bulk layer 102 formed on the lower layer side of the reference surface Ref for the mark recording, and also selection of the focal positions in the bulk layer 102 is set to be available. For this reason, an optical system in this case is provided with a focus mechanism for the recording reproduction light (expander) for adjusting a focal position of the recording reproduction laser light separately from a focus mechanism of the objective lens.

In other words, with the thus provided expander, by changing a collimation of the recording reproduction laser light that enters the objective lens, the focal position of the recording reproduction laser light is adjusted independently from the servo laser light.

A position in a tracking direction of the recording reproduction laser light is automatically controlled to be at a position immediately below the guide groove on the reference surface Ref by the tracking serve of the objective lens using the above-mentioned servo laser light.

It should be noted that when the bulk-type recording medium 100 where the mark recording is already carried out is reproduced, unlike the recording time, the position of the objective lens is not controlled on the basis of the reflection light of the servo laser light. That is, at the time of reproduction, while a mark sequence formed on the information recording layer position L that is a reproduction target (which is also referred to as information recording layer L or the mark formation layer L at the time of reproduction) is set as a target, the focus servo control and the tracking servo control on the objective lens is carried out on the basis of the reflection light of the recording reproduction laser light.

SUMMARY OF THE INVENTION

Here, in a case where the technique for recording the void is adopted in particular in the bulk-type recording medium 100 described above, due to a situation in which it is difficult to accurately control an edge position of the recording mark or the like, a mark position recording is adopted instead of the mark edge recording that represents the recording information using combinations of lengths of mark/space.

In a case where the mark position recording is adopted, to secure a stable reproduction performance, it is more important to make a void formation interval sparse than carrying out of the DSV control as in the case where the mark edge recording is carried out.

FIGS. 20A and 20B are drawings for describing this point. FIG. 20A illustrates a state of the reflection light in a case where the void formation interval in the bulk layer 102 is dense, and FIG. 20B illustrates a state of the reflection light in a case where the void formation interval in the bulk layer 102 is sparse.

In the bulk-type recording medium 100, while a consideration is given on that the recording codes subjected to the multilayer recording are read out, it is important to suppress an interlayer cross talk that is a leakage of the recording code from another layer for improving the reproduction performance. When FIGS. 20A and 20B are compared with each other, to suppress the interlayer cross talk, it is of course desirable that the number of bulks to be formed is as small as possible and sparse (the number of "1" of the recording codes).

With EFM, EFM Plus, 17PP, and the like which are the modulation codes adopted in the optical disc in related art, the DSV control can be performed at the time of the mark edge recording, but the recording code sequence where the numbers "1" are sparse may not be generated.

The present invention has been made to solve the above-mentioned problem, and it is desirable to propose a coding system suitable for a bulk recording system (multilayer recording) in which the mark position recording is carried out.

For this reason, according to an embodiment of the present invention, a coding apparatus includes: a transform table in which with regard to data words of m bits and code words of n bits where n and m are both integers and also n>m is established, $2^m$ pieces of code words selected to have a tendency that the number of symbols "1" is small among the $2^n$ pieces of code words of n bits are associated with the $2^m$ pieces of data words of m bits; and a coding unit that encodes input data words of m bits on the basis of the transform table.

Also, according to an embodiment of the present invention, a recording apparatus includes: a transform table in which with regard to data words of m bits and code words of n bits where n and m are both integers and also n>m is established, $2^m$ pieces of code words selected to have a tendency that the number of symbols "1" is small among $2^n$ pieces of the code words of n bits are associated with $2^m$ pieces of the data words of m bits; a coding unit that encodes the input data words of m bits on the basis of the transform table; and a recording unit that performs a recording on the basis of the code word output by the coding unit on an optical recording medium.

Also, according to an embodiment of the present invention, a decoding apparatus that decodes, with regard to data words of m bits and code words of n bits where n and m are both integers and also n>m is established, a code sequence obtained through a coding for transforming the input data words of m bits on the basis of a transform table in which $2^m$ pieces of code words selected to have a tendency that the number of symbols "1" is small among the $2^n$ pieces of code words of n bits are associated with $2^m$ pieces of the data words of m bits, includes: the transform table or a table in which an association between same data words and code words as those in the transform table is made as a decoding table; and a decoding unit that outputs data corresponding to the input code sequence on the basis of the decoding table.

As described above, in the coding according to the embodiment of the present invention, the transform table is prepared in which $2^m$ pieces of code words selected from the $2^n$ pieces of n bits code words so that the number of the symbols "1" tends to be small are associated with the $2^m$ pieces of data words of m bits, and the coding is carried out on the input m-bit data word on the basis of the above-mentioned transform table.

According to the embodiment of the present invention, it is possible to perform the coding in a tendency that the number of the symbols "1" becomes sparse.

Also, with regards to the code sequence obtained through the above-mentioned coding according to the embodiment of the present invention, as in the decoding apparatus according to the embodiment of the present invention, it is possible to appropriately perform the decoding while the data corresponding to the input code sequence is output on the basis of the decoding table.

According to the embodiment of the present invention, it is possible to perform the coding so that the number of the symbols "1" of the recording codes becomes small and sparse. According to this configuration, in a case where the bulk recording system in which the multilayer recording based on the mark position recording is performed in the bulk layer is adopted, the suitable coding can be performed. Then, as a result, the reproduction stability of the bulk-type recording medium can be realized.

Also, with the coding apparatus (and the decoding apparatus) according to the embodiment of the present invention, it is possible to appropriately decode the code sequence obtained in the embodiment of the present invention.

BRIEF DESCRIPTION OF THE DRAWINGS

FIG. 3 illustrates a data structure (part of an initial section) of a transform table according to a first embodiment;

FIG. 4 illustrates a data structure (continued) of the transform table according to the first embodiment;

FIG. 14 illustrates a data structure (part of an initial section) of a transform table according to a second embodiment;

FIG. 15 illustrates a data structure (continued) of the transform table according to the second embodiment;

DESCRIPTION OF THE PREFERRED EMBODIMENTS

Hereinafter, preferred modes for implementing the present invention (which will be hereinafter referred to as embodiments) will be described.

Figure 1:
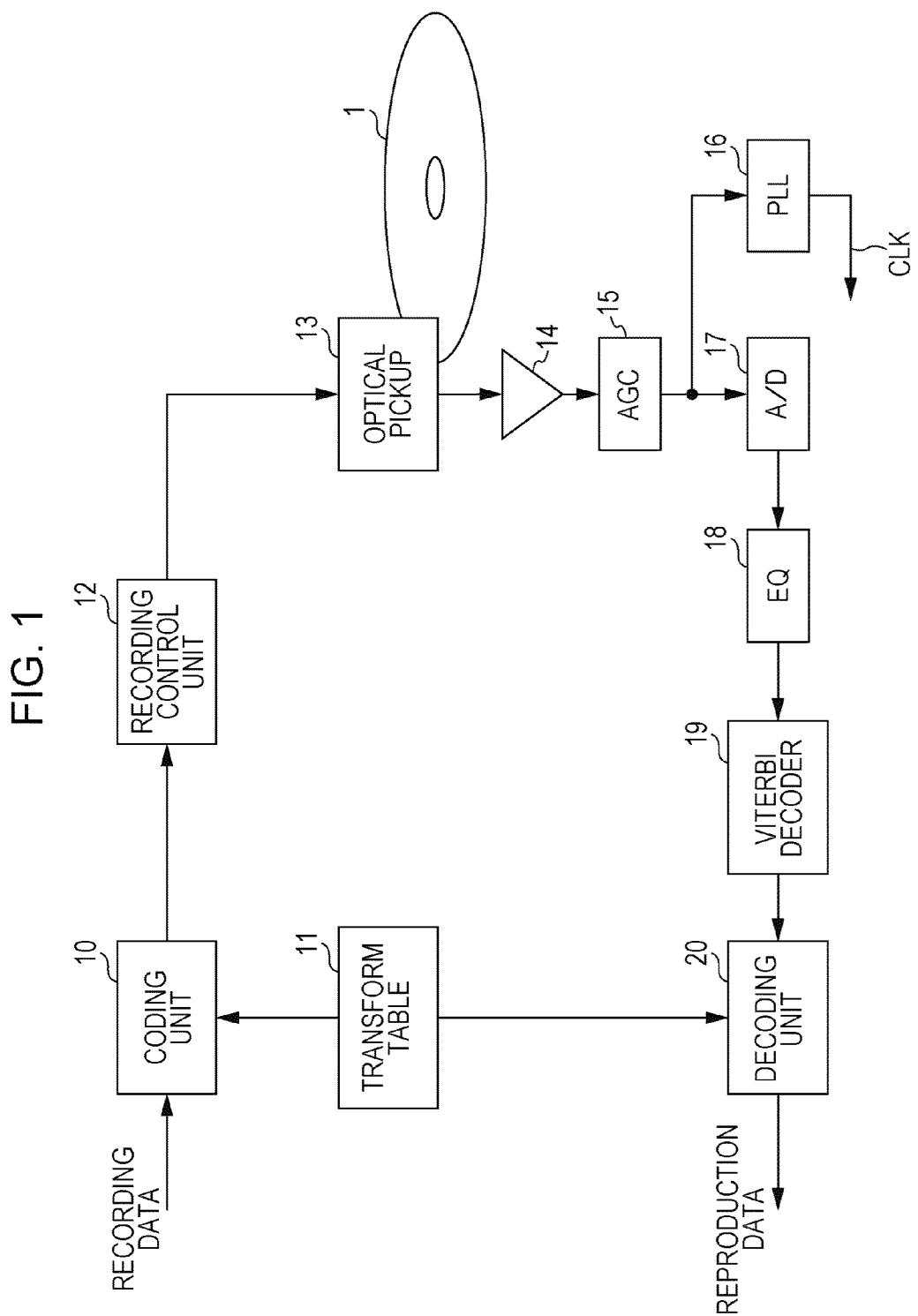
FIG. 1 illustrates an internal configuration of a recording reproduction apparatus according to an embodiment.

It should be noted that the description will be made in the following order.
First Embodiment
1. Configurations of recording reproduction apparatus and optical recording medium
2. Example of transform table
3. Coding according to the first embodiment
   3-1. Internal configuration of coding unit
   3-2. Specific method for coding
   3-3. Processing procedure
   3-4. Summary of coding according to the first embodiment
4. Decoding according to the first embodiment
   4-1. Internal configuration of decoding unit
   4-2. Specific method for decoding
   4-3. Processing procedure
5. Simulation result
Second Embodiment
6. Coding according to the second embodiment
7. Decoding according to the second embodiment
8. Modified example
First Embodiment
1. Configurations of Recording Reproduction Apparatus and Optical Recording Medium FIG. 1 illustrates an internal configuration of a recording reproduction apparatus according to an embodiment of the present invention.

First, a bulk-type recording medium 1 in the drawing is a bulk-type optical recording medium having a recording layer as a bulk layer similarly as in the medium described above in FIG. 19.

The bulk-type recording medium 1 is composed of a disc-like optical recording medium, and mark recording (information recording) is carried out while laser light irradiation is performed on the bulk-type recording medium 1 rotated to be driven. Also, reproduction of the recorded information is carried out while the bulk-type recording medium 1 rotated to be driven is irradiated with laser light.

It should be noted that the optical recording medium is a collective term for recording media where information recording/reproduction is carried out through light irradiation.

Figure 2:
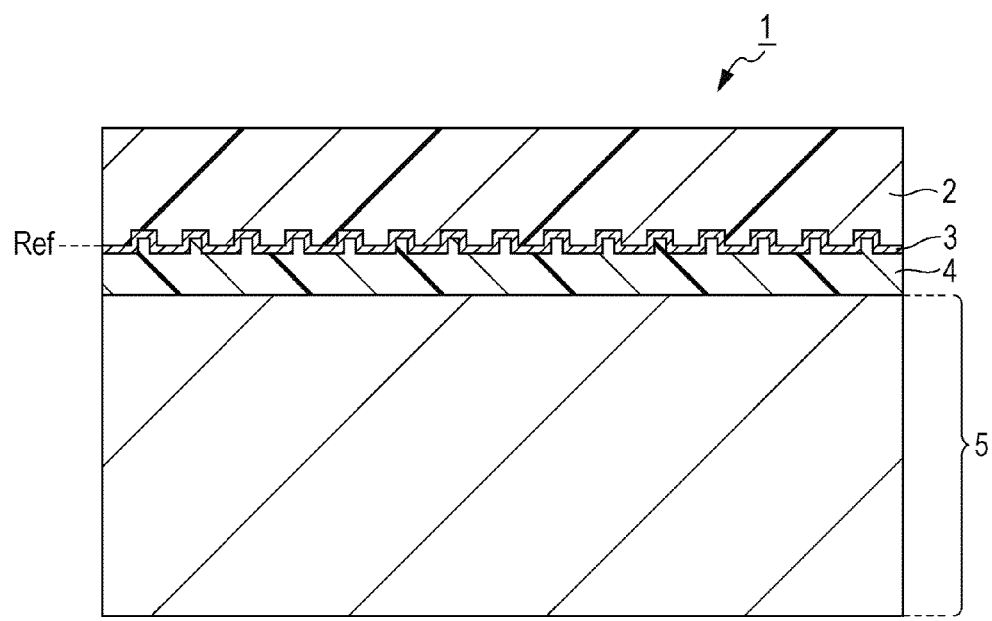
FIG. 2 is a cross sectional structural drawing of an optical recording medium that is a recording/reproduction target according to the embodiment.

Herein, FIG. 2 is a cross sectional structural drawing of the bulk-type recording medium 1.

As illustrated in this FIG. 2, on the bulk-type recording medium 1, a cover layer 2, a selective reflection film 3, an intermediate layer 4, and a bulk layer 5 are sequentially formed from an upper layer side.

It should be noted that in the present specification, an "upper layer side" refers to an upper layer side when a light incident surface side from the apparatus side that performs the laser light irradiation for carrying out the recording or reproduction is set as an upper surface.

Also, in the present specification, a term "depth direction" is used. This "depth direction" refers to a direction matched with an up and down direction that follows a definition of the above-mentioned "upper layer side" (in this instance, a direction parallel to the incident direction of the laser light from the apparatus side: focus direction).

In the bulk-type recording medium 1, the above-mentioned cover layer 2 is made, for example, of resin such as polycarbonate or acrylic. As illustrated in the drawing, a guide groove is formed as a position guiding element for guiding recording/reproduction positions on a lower surface of the cover layer 2. The guide groove has a concave-convex cross sectional shape as illustrated in the drawing. The position guiding element is formed in a spiral or concentric manner.

The above-mentioned guide groove is formed of a successive groove (groove) or a pit sequence. For example, in a case where the guide groove is formed of the pit sequence, positional information is recorded through combinations of lengths of pits and lands (absolute positional information: such as radial positional information or rotation angle information functioning as information representing a rotation angle position on the disc). Alternatively, in a case where the guide groove is set as the groove, while the groove is formed so as to periodically have a wobble, the recording of the positional information is carried out on the basis of periodic information of the wobble.

The cover layer 2 is generated, for example, through injection molding using a stamper on which the above-mentioned guide groove (concave-convex shape) is formed.

Also, the selective reflection film 3 is formed on the lower surface side of the above-mentioned cover layer 2 on which the above-mentioned guide groove is formed.

Herein, as also described above, in the bulk recording system, the bulk layer 5 functioning as the recording layer is irradiated with light for obtaining an error signal of the tracking or focus on the basis of the above-mentioned guide groove (the servo laser light) separately in addition to the light for carrying out the mark recording/reproduction (the recording reproduction laser light).

At this time, if the above-mentioned servo laser light reaches the bulk layer 5, the mark recording in the bulk layer 5 may be adversely affected. For this reason, the reflection film having a selectivity in which the servo laser light reflects and the recording reproduction laser light transmits is used.

Up to now, in the bulk recording system, laser lights mutually having different wavebands are used for the recording reproduction laser light and the servo laser light, and to correspond to this configuration, the reflection film having a wavelength selectivity in which light having the same waveband as the servo laser light reflects and light having other wavebands transmits is used for the above-mentioned selective reflection film 3.

In the case of the present example, the recording reproduction laser light is set to have a wavelength=approximately 405 nm, the servo laser light is set to have a wavelength=approximately 640 nm.

The bulk layer 5 functioning as the recording layer is laminated (adhered) on the lower layer side of the above-mentioned selective reflection film 3 via the intermediate layer 4 composed, for example, of an adhesive material such as UV cured resin.

For the formation material (recording material) of the bulk layer 5, for example, a suitable material may appropriately be adopted in accordance with the above-described positive-type micro hologram system or the negative-type micro hologram system, or the bulk recording system adopting the void recording system or the like.

It should be noted that the mark recording system for the optical recording medium that is the target of the embodiment of the present invention should not be particularly limited, and an arbitrary system may be adopted within the category of the bulk recording system. In the following description, as an example, a case will be exemplified in which the void recording system is adopted.

Figure 19:
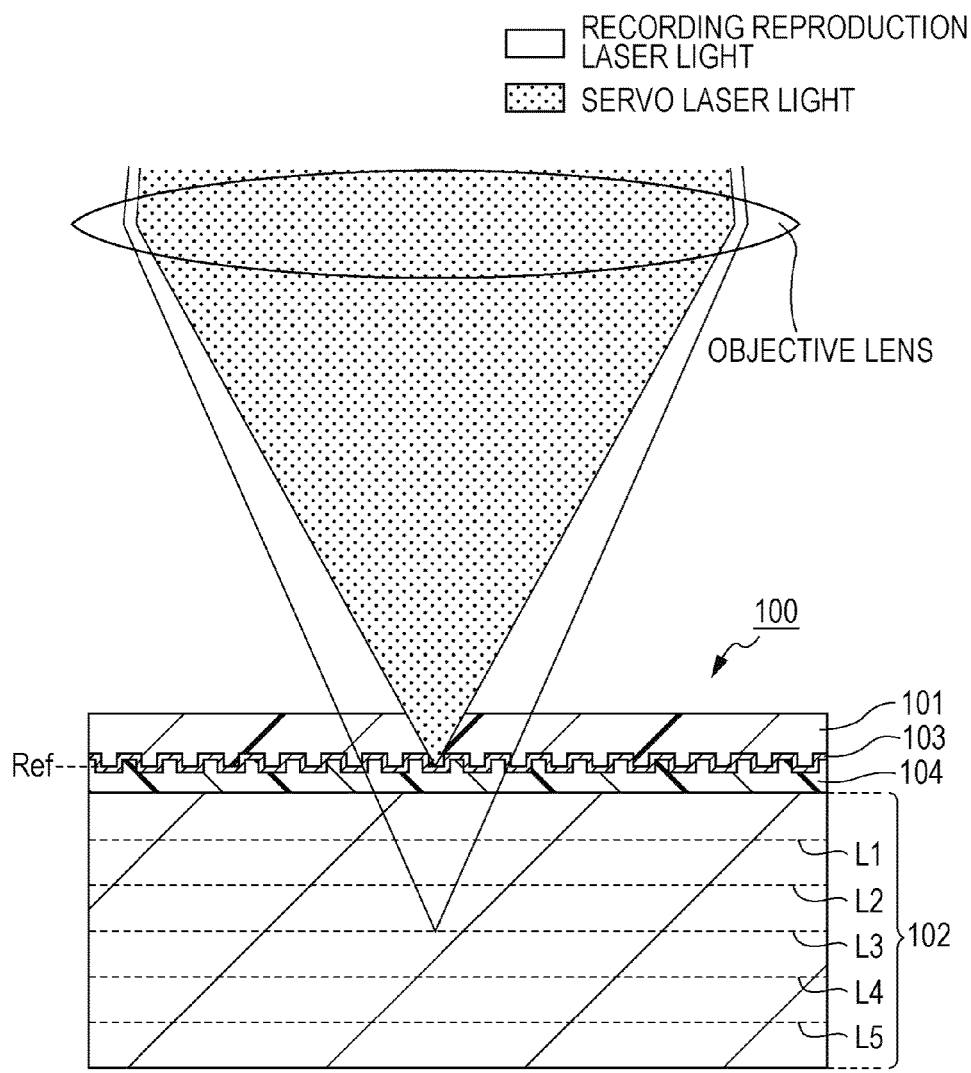
FIG. 19 is an explanatory diagram for describing a cross sectional structure of an actual bulk-type recording medium provided with a reference surface and a servo control at the time of recording/reproduction.

Herein, in the bulk-type recording medium 1 having the above-mentioned configuration, the selective reflection film 3 on which the position guiding element is formed as the above-mentioned guide groove becomes a reflection surface that becomes a reference for carrying out the positional control of the recording reproduction laser light on the basis of the servo laser light as also described above. In this sense, the surface on which the selective reflection film 3 is formed is referred to as the reference surface Ref according to the embodiment too.

as also described in FIG. 19 above, in the bulk-type optical recording medium, to perform the multilayer recording in the bulk layer, respective layer positions where information recording should be performed (the information recording layer positions L) are set in advance. Although a description based on an illustration in the drawing will be omitted, in the bulk-type recording medium 1 according to the present embodiment too, the information recording layer positions L are set by the number to be used.

Herein, specific examples of the respective layer positions will be described. The information recording layer position L located on the uppermost section is set as a position at approximately 100 μm from the front surface (uppermost surface) of the bulk-type recording medium 1. Also, the information recording layer position L located on the lowermost section is set as a position at approximately 300 μm from the above-mentioned front surface.

Then, with regard to the respective information recording layer positions L between the information recording layer position L on the uppermost section and the information recording layer position L on the lowermost section, 10 μm of intervals between the adjacent respective information recording layer positions L are provided in average while taking into account the interlayer cross talk.

Incidentally, the position of the reference surface Ref is at a position at approximately 50 μm from the above-mentioned surface, and therefore the interval from the reference surface Ref to the information recording layer position L on the uppermost section is approximately 50 μm.

The description will be given while referring back to FIG. 1 again.

In the recording reproduction apparatus according to the embodiment, an optical pickup 13 for performing the laser light irradiation for the recording/reproduction on the bulk-type recording medium 1 is provided.

In the optical pickup 13, a recording reproduction laser light source and a servo laser light source for respectively outputting the recording reproduction laser light and the servo laser light described in FIG. 19 above are provided. Also, an objective lens for collecting the recording reproduction laser light and the servo laser light together to irradiate the bulk-type recording medium 1 with the lights and a biaxial actuator for holding the objective lens so as to be driven in the tracking direction and the focus direction are also provided. Furthermore, a spectral element (for example, a dichroic prism or the like) for combining the recording reproduction laser light and the servo laser light output from the above-mentioned respective light sources on the same axis to be guided to the objective lens and also splitting the reflection light of the recording reproduction laser light and the reflection light of the servo laser light incident via the objective lens from the bulk-type recording medium 1 into separate light paths, a recording reproduction light reception unit that receives the above-mentioned reflection light of the recording reproduction laser light, and a servo light reception unit that receives the reflection light of the above-mentioned servo laser light are also provided.

Also, a recording reproduction light focus mechanism (expander) that changes the collimation the recording reproduction laser light incident on the objective lens is also provided as described in FIG. 19 above. With the provision of this recording reproduction light focus mechanism, at the time of recording, under a situation where the focus servo is carried out on the objective lens while is set as the target the reference surface Ref by using the servo laser light, it is possible to selectively record the mark on a desired information recording layer position L set in the bulk layer 5.

It should be noted that in actuality, the recording reproduction apparatus is also provided with a servo circuit that performs a control on the irradiation position of the laser light on the basis of the reflection light of the servo laser light at the time of recording as described in FIG. 19 above and a control on the irradiation position of the laser light on the basis of the reflection light of the recording reproduction laser light at the time of reproduction, a slide mechanism for the optical pickup 13, and a spindle motor that rotates and drives the bulk-type recording medium 1, but these configurations does not directly relates to the coding processing or the decoding processing according to the embodiment, and an illustration thereof is omitted herein.

Then, the recording reproduction apparatus is provided with a coding unit 10 and a transform table 11 in the drawing for a structure for generating a code sequence that should be recorded in the bulk layer 5 (recording code sequence).

The coding unit 10 sequentially encodes the m-bit data words by using the transform table 11 for the output with regard to the input recording data.

It should be noted that the internal configuration of the coding unit 10 and the coding processing performed by the coding unit 10 according to the embodiment will be described below again.

Herein, the transform table 11 is stored in a desired memory apparatus provided in the recording reproduction apparatus.

The recording code sequence obtained through the coding processing performed by the coding unit 10 is supplied to a recording control unit 12.

The recording control unit 12 causes and drives the recording reproduction laser light source in the optical pickup 13 to emit the light on the basis of the above-mentioned recording code sequence for executing the mark recording in the bulk layer 5.

In this case, the recording control unit 12 does not apply the NRZ (Non Return to Zero) modulation processing, which is performed in an optical disc system in related art such as for example a DVD (Digital Versatile Disc) or a BD (Blu-ray Disc: registered trademark), on the above-mentioned recording code sequence but causes and drives the above-mentioned recording reproduction laser light source to emit the light for carrying out the so-called mark position recording.

In the case of the present example, the recording control unit 12 causes and drives the above-mentioned recording reproduction laser light source to emit the light so that the mark is recorded while corresponding to a symbol "1" of the above-mentioned recording code sequence and the space is formed while corresponding to a symbol "0".

Also, the reflection light from the mark recorded on the bulk-type recording medium 1 is detected by the above-mentioned recording reproduction light reception unit in the optical pickup 13, and a reproduction signal (hereinafter, which will be also referred to as reproduction signal RF) is obtained.

After the reproduction signal with regard to the thus obtained mark sequence is amplified by an amplifier 14, the reproduction signal is subjected to a gain adjustment in an AGC (Auto Gain Control) circuit 15.

Then, the reproduction signals passing through the AGC circuit 15 are respectively supplied to a PLL (Phase Locked Loop) circuit 16 and an A/D converter 17 as illustrated in the drawing.

The PLL circuit 16 generates a clock CLK through a PLL processing based on the above-mentioned reproduction signal. The clock CLK is supplied as a clock for the respective unit to be used such as the A/D converter 17.

The A/D converter 17 performs digital sampling on the above-mentioned reproduction signal. The reproduction signal subjected to the sampling by the A/D converter 17 is supplied to an equalizer (EQ) 18.

The equalizer 18 and a Viterbi decoder 19 are provided for digitalizing the reproduction signal in a so-called PRML (Partial Response Most Likelihood) decoding system.

The equalizer 18 applies a PR equalization processing on the reproduction signal subjected to the sampling by the A/D converter 17 in accordance with a predetermined PR class (for example, 1:2:2:1, 1:2:2:2:1, or the like) to be output to the Viterbi decoder 19.

The Viterbi decoder 19 performs a Viterbi decoding processing on the reproduction signal subjected to the PR equalization to obtain a binary reproduction signal.

The binary reproduction signal obtained by the Viterbi decoder 19 (equivalent to the above-mentioned recording code sequence) is supplied to a decoding unit 20.

The decoding unit 20 sequentially transforms the code sequence that is the above-mentioned binary reproduction signal into the m-bit data word by using the transform table 11 so that a reproduction data sequence is obtained. That is, the decoding unit 20 is adapted to perform a decoding processing for obtaining reproduction data that is obtained by reproducing the above-described recording data.

It should be noted that this internal configuration of the decoding unit 20 and a specific content of the decoding processing using the transform table 11 will be also described below again.

Herein, the configuration of the recording reproduction apparatus illustrated in FIG. 1 should not be limited to this.

For example, the case is exemplified in which the binary processing on the reproduction signal RF is performed though the PRML decoding processing, but the binary technique for the reproduction signal RF should not be limited to this.

Also, it is also possible that the PLL processing at a time when the clock CLK is generated is realized, for example, through a digital PLL processing such as an ITR (Interpolated Timing Recovery) system.

2. Example of Transform Table

A description will be given of the transform table 11 used in the coding/decoding according to the first embodiment.

First, as a premise, according to the embodiment, in the transform table 11, an n-bit code word is associated with an m-bit data word (where m and n are both an integer larger than or equal to 1, and also n>m is established). To be more specific, in the case of the present embodiment, while m=16 and n=29 are established, a 29-bit code word is associated with a 16-bit data word.

Also, according to the embodiment, the coding is carried out so that the code sequence obtained as the coding result satisfies runlength constraints of a minimum successive 0 length d ($d \neq 0$) and a maximum successive 0 length k (k>d). To be more specific, in the case of the present embodiment, the runlength constraints are set so that d=2 and also k=12 are satisfied. In other words, the constraints are set so that the successive length of "0" between the symbols "1" is larger than or equal to 2 and smaller than or equal to 12.

Herein, one of the reasons for setting such runlength constraints is that the void recording is carried out as the bulk recording in the present example. That is, like the present example, in a case where the void is recorded in the bulk layer 5, if the distance between the marks (in other words, the distance between the symbols "1" in the code sequence) is too close, a fusion with the adjacent void occurs, and the recording codes are not correctly reproduced. For this reason, the constraint on the minimum successive 0 length d is applied.

On the other hand, when timing synchronization is carried out in the PLL circuit 16, a phase error signal between a timing when "1" of the reproduction signal RF is obtained and an edge of the clock CLK is obtained. At this time, if "1" of the reproduction signal RF does not appear in a certain interval in terms of time, the number of occasions to carry out the PLL synchronization becomes small, and a clock jitter becomes large. In view of the above, the constraint on the maximum successive 0 length is also applied.

On the basis of these premises, in the present example, the code words to be stored in the transform table 11 are selected as follows.

First, among binary code words of n=29 bits ($2^{29}$ pieces), 80,966 code words satisfy the runlength constrains of d=2 and also k=12. Then, among these, 68,182 code words satisfy a condition where the number of the symbols "0" in a section beginning with the symbol "1" and ending with the next symbol "1" is smaller than or equal to (k−1) or the number of the successive symbols "0" of the leading edge is smaller than or equal to ((k/2)−1)) as a condition with regard to the leading edge of the code word and also satisfy a condition where the number of the successive symbols "0" of the trailing edge is smaller than or equal to k/2 or the number of the symbols "0" in a section ending with the symbol "1" and the previous symbol "1" is smaller than or equal to (k−1) as a condition with regard to the trailing edge of the code.

This set of 68,182 code words is selected so that the code sequence of (n×2+1) bits merged with the merging bit can satisfy the above-mentioned runlength constraints on the premise of insertion of the merging bit which will be described below and will be hereinafter denoted as S0.

Then, according to the present embodiment, among the thus selected S0 code word set, 65,536 pieces where the number of the symbols "1" is small in one code word are extracted to be stored in the transform table 11.

Herein, the number of the symbols "1" in the code words will be also referred to as "occurrence".

FIG. 3 and FIG. 4 illustrate a data structure of the transform table 11.

It should be noted that in these FIG. 3 and FIG. 4, a Data column in the drawing represents data words (HEX notation), and a Code column represents code words (binary notation). Also, the Occ column represents occurrence.

As will be understood while referring to these FIG. 3 and FIG. 4, in the transform table 11 according to the present embodiment, the n-bit code words sequentially extracted from ones with a smaller occurrence among the above-mentioned S0 code word set are associated with the m-bit data words.

Figure 5:
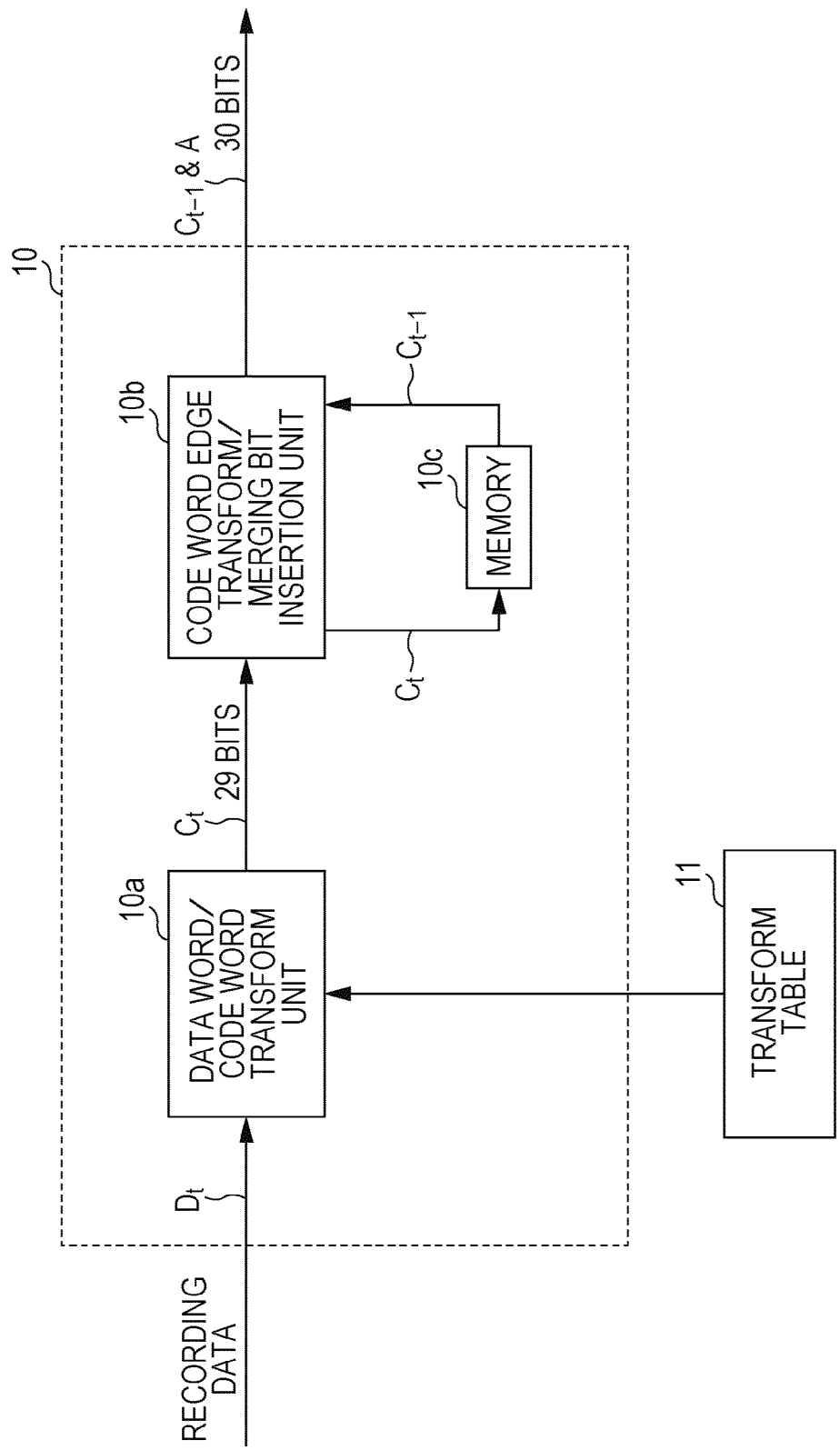
FIG. 5 illustrates an internal configuration of a coding unit.

3. Coding According to the First Embodiment 3-1. Internal Configuration of Coding Unit FIG. 5 illustrates an internal configuration of the coding unit 10 illustrated in FIG. 1.

It should be noted that in this drawing, the transform table 11 illustrated in FIG. 1 is also illustrated together with the internal configuration of the coding unit 10.

As illustrated in the drawing, a data word/code word transform unit 10a, a code word edge transform/merging bit insertion unit 10b, and a memory 10c are provided in the coding unit 10.

The recording data also illustrated in FIG. 1 is input to the data word/code word transform unit 10a.

For each data word of m=16 bits input as the recording data, the data word/code word transform unit 10a searches the transform table 11 for the corresponding code word of n=29 bits to be output.

Herein, an input data word of m bits at a certain time t is represented by "$D_t$" as in the drawing.

Also, the code word of n bits obtained by transforming the input data word $D_t$ in the transform table 11 is represented by "$C_t$".

The code word edge transform/merging bit insertion unit 10b inserts the merging bit of "a" bits (a is an integer larger than or equal to 1) between two n-bit code words ($C_{t-1}$ and $C_t$) which are successive in terms of time with regard to the n-bit code words sequentially input from the data word/code word transform unit 10a described above and also transforms values of the trailing edge of the code word $C_{t-1}$ and the leading edge of the code word $C_t$ when requested.

In this case, a=1 is set, and the code word edge transform/merging bit insertion unit 10b is adapted to sequentially output codes of total 30 bits obtained by adding the 1-bit merging bit to the n-bit code word ($C_{t-1}$) (in the drawing, $C_{t-1}$ & A).

It should be noted that the specific processing content by the code word edge transform/merging bit insertion unit 10b will be described below.

The memory 10c is provided so that the code word edge transform/merging bit insertion unit 10b holds the code word $C_t$ as the code word $C_{t-1}$ at a previous time by one moment.

3-2. Specific Method for Coding

Figure 6:
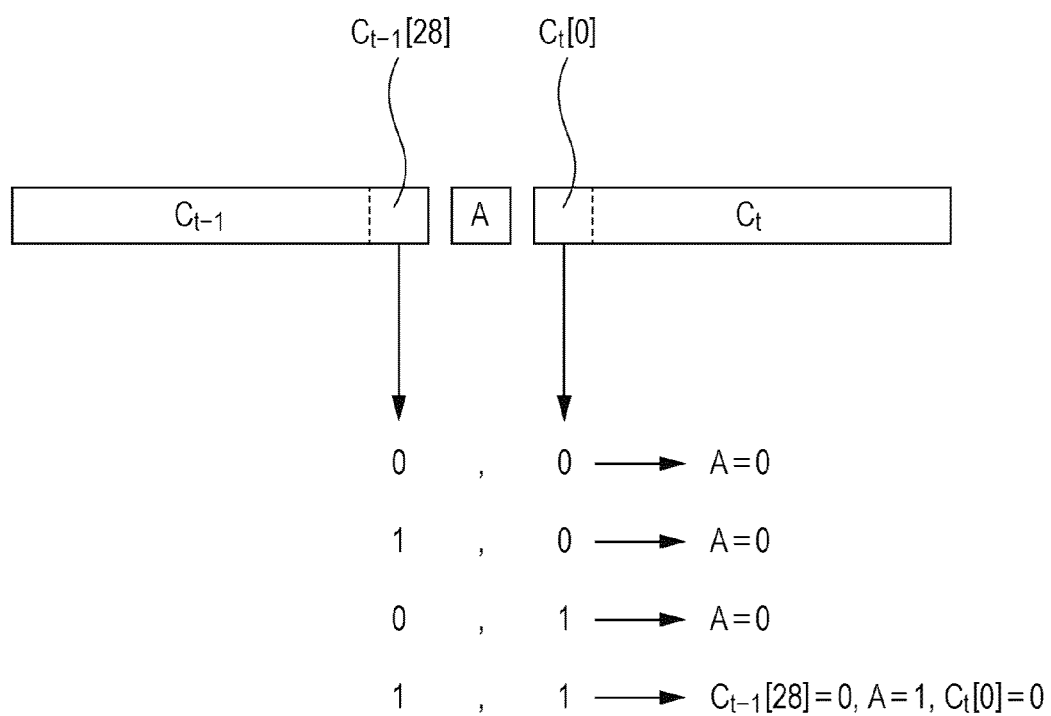
FIG. 6 is an explanatory diagram for describing a coding technique including an insertion of a merging bit according to the first embodiment.

FIG. 6 is an explanatory diagram for describing the coding technique including the insertion of the merging bit according to the first embodiment.

First, in the coding in this case, at the time of the insertion of the merging bit, a value of the trailing edge bit of the code word $C_{t-1}$ (represented by $C_{t-1}[28]$) and a value of the leading edge bit of the code word $C_t$ (represented by $C_t[0]$) are obtained.

Then, as also illustrated in the drawing, in a case where ($C_{t-1}[28]$, $C_t[0]$) are (0, 0) or (1, 0) or (0, 1), "0" is inserted as the merging bit (A).

On the other hand, in a case where ($C_{t-1}[28]$, $C_t[0]$)=(1, 1) is established, $C_{t-1}[28]$ and $C_t[0]$ are transformed into "0", and also "1" is inserted as the merging bit (A).

By carrying out the above-mentioned merging bit insertion processing, as the premise that the coding rate is increased as much as possible, the selection condition on the code words for satisfying the runlength constraints can be alleviated.

For example, if the above-mentioned insertion of the merging bit is not carried out, to satisfy the runlength constraints of d=2 and also k=12, a condition in which one starting with the symbol "1" and one ending with the symbol "1" are excluded is further added to the selection condition on the above-mentioned S0 code word set. In some cases, the number of code words having a small occurrence among the S0 code word set may be decreased.

As will be understood from this situation, as the above-mentioned insertion of the merging bit is carried out, to satisfy the predetermined runlength constraints while a certain coding rate is increased as much as possible, and it is possible to realize that more code words having the small occurrence tend to be stored in the transform table 11.

Also, according to the above-mentioned merging bit insertion processing, in a case where $C_{t-1}[28]$=1 and also $C_t[0]$=1 are established, the transform into $C_{t-1}[28]$=0 and $C_t[0]$=0 occurs, and in this point too, it is possible to realize the coding where the symbols "1" become more sparse.

3-3. Processing Procedure

Figure 7:
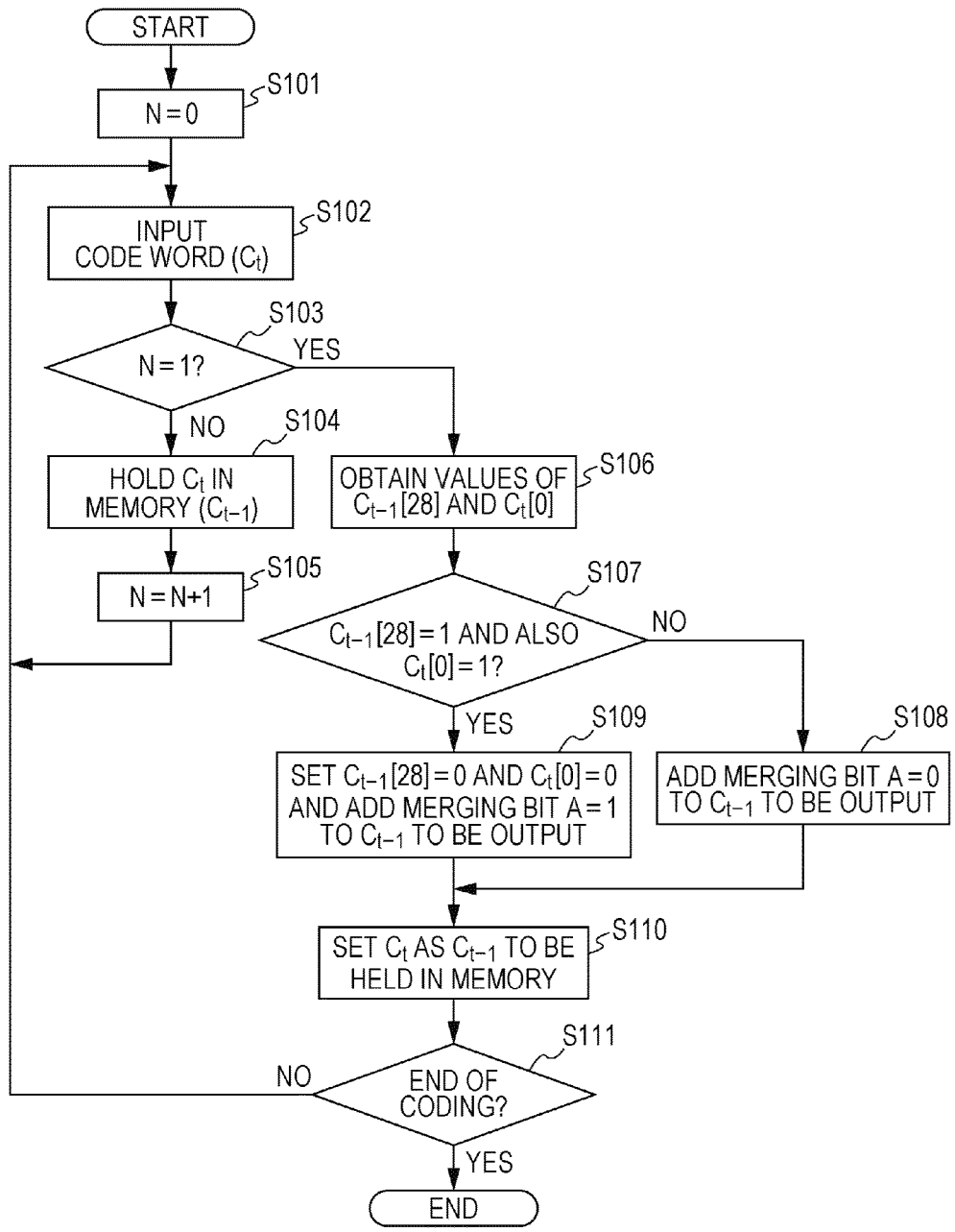
FIG. 7 is a flow chart illustrating a specific procedure of a coding processing according to the first embodiment.

FIG. 7 is a flow chart illustrating a procedure of a specific processing that is to be performed for realizing the coding processing according to the first embodiment described above.

It should be noted that this FIG. 7 illustrates a specific processing procedure that is to be performed by the code word edge transform/merging bit insertion unit 10b illustrated in FIG. 5.

In FIG. 7, first, in step S101, N=0 is set. Herein, N denotes an identifier for identifying whether or not the input of the code word from the data word/code word transform unit 10a is the first-time input. N=0 represents the first-time input, and N=1 represents a subsequent input after the first-time input.

Then, in the subsequent step S102, a code word ($C_t$) is input. In the next step S103, it is determined whether or not N=1 is established. In a case where the negative result is obtained as N=1 is not established, in step S104, the code word $C_t$ is held in the memory 10c (which becomes a code word $C_{t-1}$ at the next time moment). Then, in step S105, N=1 is set, and the flow returns to the previous step S102.

In this manner, the code word input in the first time is first only held in the memory 10c.

On the other hand, in step S103, in a case where the positive result is obtained as N=1 is established, in step S106, values of $C_{t-1}$[28] and $C_t$[0] are obtained. In the subsequent step S107, it is determined whether or not $C_{t-1}$[28]=1 and also $C_t$[0]=1 are established.

In step S107, in a case where the negative result is obtained as $C_{t-1}$[28]=1 and also $C_t$[0]=1 are not established, in step S108, the code word $C_{t-1}$ is added with the merging bit A=0 to be output, and the flow advances to the S110.

On the other hand, in step S107, in a case where the positive result is obtained as $C_{t-1}$[28]=1 and also $C_t$[0]=1 established, in step S109, $C_{t-1}$[28]=0 and $C_t$[0]=0 are set, and the code word $C_{t-1}$ is added with the merging bit A=1 to be output.

After the processing in the relevant step S109 is performed, the flow advances to the S110.

In step S110, the code word $C_t$ is set as the code word $C_{t-1}$ to be held in the memory 10c.

Then, in the subsequent step S111, it is determined whether or not a state is established that the coding should be ended. To be more specific, in this step S111, for example, it is determined whether or not the predetermined condition set in advance so that the coding processing should be ended is established on the basis of a coding stop instruction from a control unit whose illustration in the drawing is omitted.

In step S111, in a case where the negative result is obtained as the coding should not be ended yet, the flow returns to the previous step S102.

On the other hand, in a case where the positive result is obtained as the coding should be ended, the series of processings illustrated in this drawing are ended.

3-4. Summary of Coding According to the First Embodiment

As described above, according to the present embodiment, the coding with regard to the input data words is carried out on the basis of the transform table 11 in which the $2^m$ pieces of code words selected so as to have the small occurrence from the $2^n$ pieces of n-bit code words are associated with the $2^m$ pieces of data words of m bits.

According to the present embodiment where the coding processing using the transform table 11 described above is carried out, the number of the symbols "1" in the above-mentioned recording code sequence can be set to be small. In other words, it is possible to obtain the above-mentioned recording code sequence where the symbols "1" are sparse.

Also, according to the present embodiment, the merging bit insertion processing is carried out in which in a case where $(C_{t-1}[28], C_t[0])$ are (0, 0) or (1, 0) or (0, 1), "0" is inserted as the merging bit, and in a case where $(C_{t-1}[28], C_t[0])=(1, 1)$ is established, $C_{t-1}[28]$ and $C_t[0]$ are transformed into "0", and also "1" is inserted as the merging bit.

By performing the above-mentioned merging bit insertion processing, it is possible to alleviate the selection condition on the S0 code word set as described above, and more code words having the small occurrence tend to be stored in the transform table 11. As a result, it is possible to generate the above-mentioned more sparse recording code sequence. Also, at the same time, as described above, in a case where $(C_{t-1}[28], C_t[0])=(1, 1)$ is established, $C_{t-1}[28]$ and $C_t[0]$ are transformed into "0", and therefore in this point too, it is possible to generate the above-mentioned more sparse recording code sequence.

Also, the coding according to the present embodiment described above has the coding rate=16/30, which is improved by 6.7% as compared with the coding rate=1/2 of (2,7) RLL exemplified above. In other words, accordingly, with the coding according to the present embodiment, the higher recording density is realized.

4. Decoding According to the First Embodiment 4-1. Internal Configuration of Decoding Unit A technique for decoding the code sequence generated through the above-mentioned coding according to the first embodiment into the data sequence will be described below.

Figure 8:
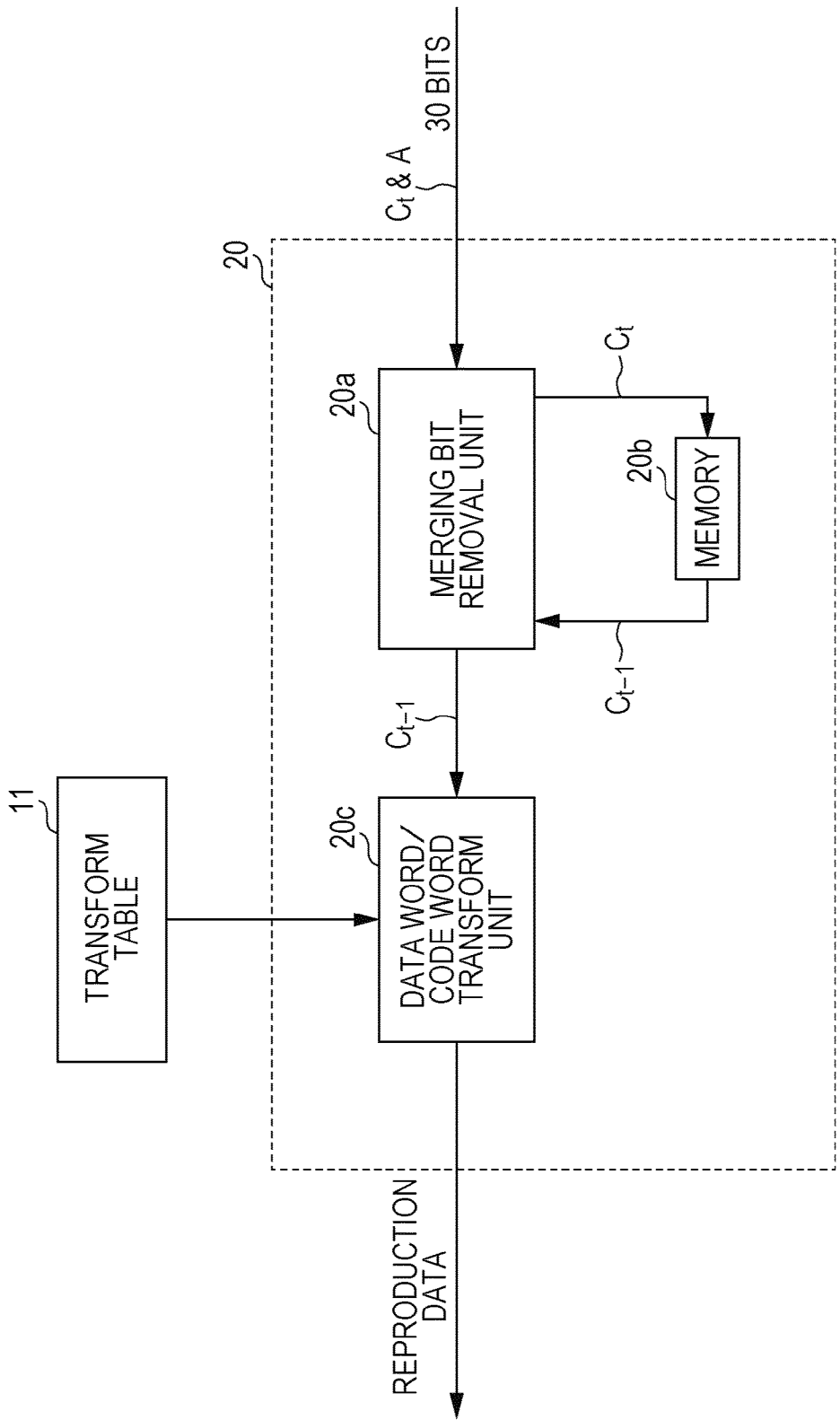
FIG. 8 illustrates an internal configuration of a decoding unit.

FIG. 8 illustrates an internal configuration of the decoding unit 20 illustrated in FIG. 1.

It should be noted that in this drawing, the transform table 11 illustrated in FIG. 1 is also illustrated together with the internal configuration of the decoding unit 20.

A merging bit removal unit 20a, a memory 20b, and a code word/data word transform unit 20c are provided in the decoding unit 20.

The binary reproduction signal from the Viterbi decoder 19 illustrated in FIG. 1 is input to the merging bit removal unit 20a.

Herein, the above-mentioned binary reproduction signal corresponds to the code sequence output by the code word edge transform/merging bit insertion unit 10b described above. In this sense, in FIG. 8, the binary reproduction signal input to the merging bit removal unit 20a is represented as "$C_t$ & A (30 bits)".

The merging bit removal unit 20a inputs the above-mentioned binary reproduction signal for every 30 bits and performs removal of the merging bit A and, when requested, transform of the values of $C_{t-1}[28]$ and $C_t[0]$ to sequentially outputs the code words of n=29 bits.

It should be noted that a specific processing content performed by the merging bit removal unit 20a will be described below again.

The memory 20b is provided so that the merging bit removal unit 20a holds the code word ($C_{t-1}$) at the previous time by one moment.

The code word/data word transform unit 20c sequentially transforms the code words of n=29 bits which are sequentially input from the merging bit removal unit 20a into the data words of m=16 bits by using the transform table 11.

4-2. Specific Method for Decoding

Figure 9:
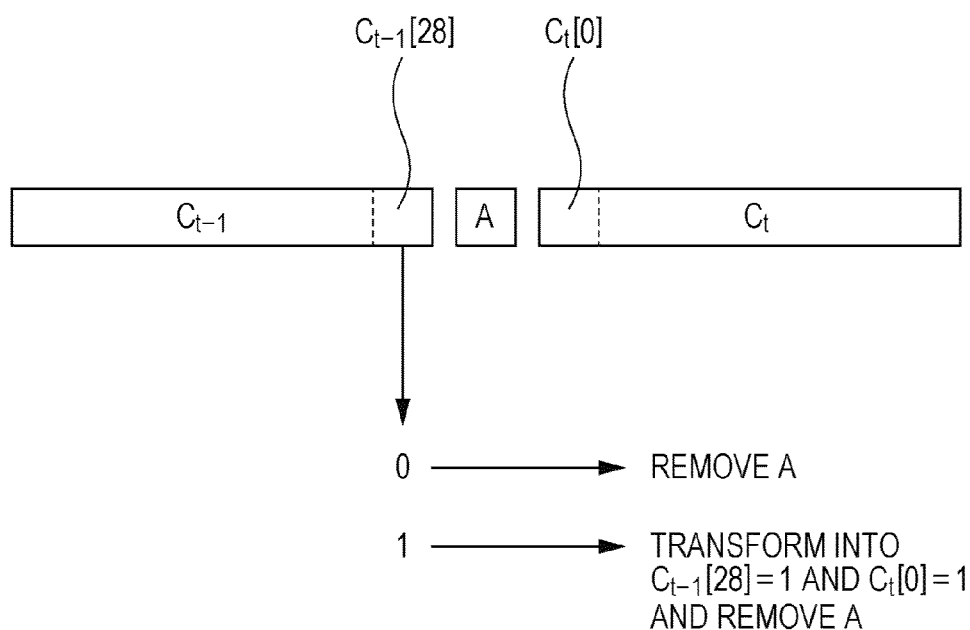
FIG. 9 is an explanatory diagram for describing a decoding technique including a removal of the merging bit according to the first embodiment.

FIG. 9 is an explanatory diagram for describing a decoding technique including a removal of the merging bit according to the first embodiment.

In the decoding in this case, first, the value of the merging bit A inserted between the code word $C_{t-1}$ and the code word $C_t$ is obtained. Then, in a case where the value of the merging bit A is "0", the merging bit A is simply removed, and the code word $C_{t-1}$ is output.

On the other hand, in a case where the value of the merging bit A is "1", $C_{t-1}[28]$ and $C_t[0]$ are transformed into "1", and the merging bit A is removed to output the code word $C_{t-1}$.

The code words of n=29 bits sequentially output through the above-mentioned merging bit removal processing are sequentially transformed into the data words of m=16 bits by the code word/data word transform unit 20c illustrated in FIG. 8. According to this, it is possible to obtain the reproduction data reconstructed from the recording data illustrated in FIG. 1. In other words, as a result, the above-mentioned recording code sequence obtained through the coding processing according to the above-described embodiment can be appropriately decoded.

4-3. Processing Procedure

Figure 10:
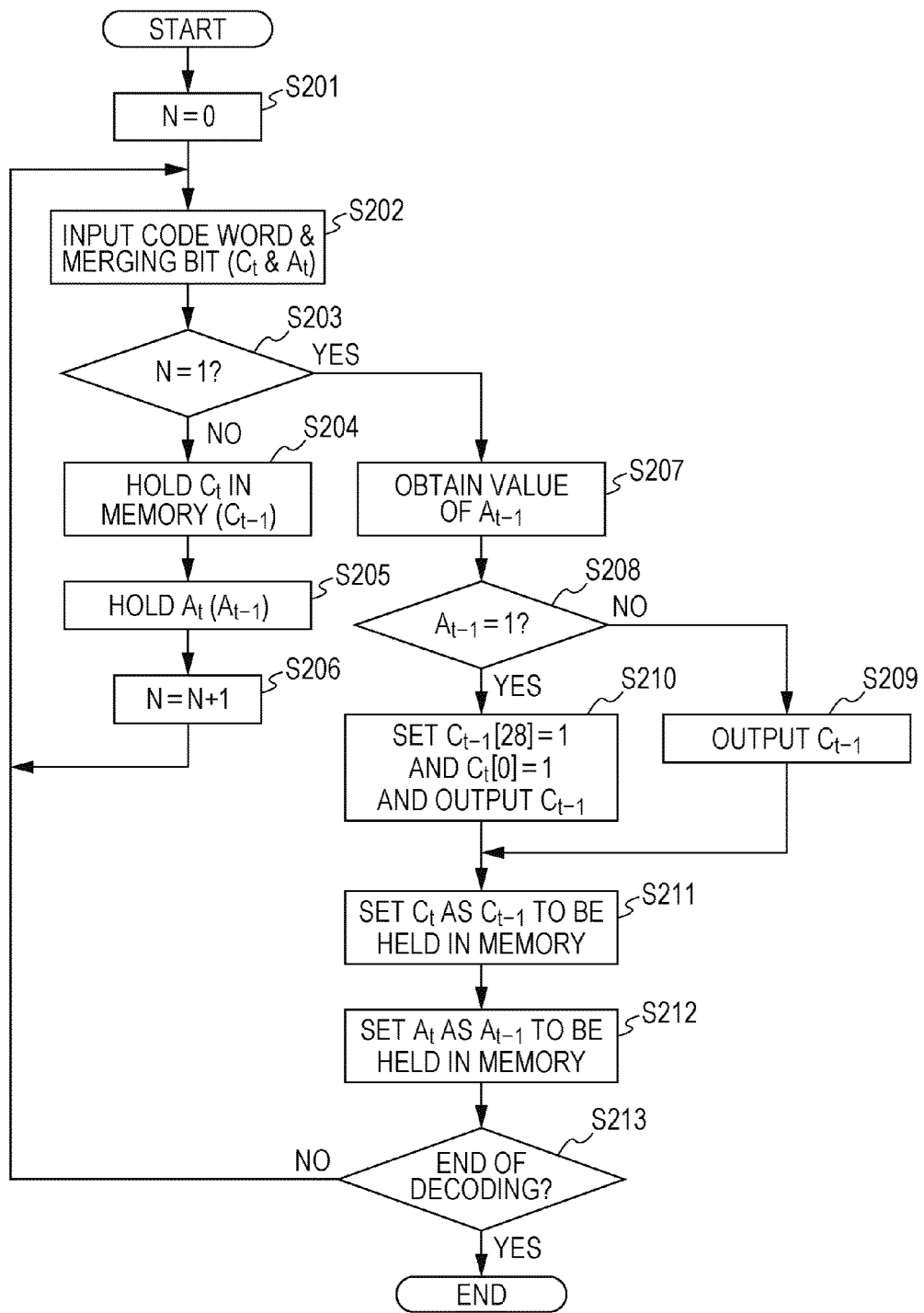
FIG. 10 is a flow chart illustrating a specific procedure of a decoding processing according to the first embodiment.

FIG. 10 is a flow chart illustrating a procedure of a specific processing that is to be performed for realizing the decoding processing according to the first embodiment described above.

It should be noted that this FIG. 10 illustrates a specific processing procedure that the merging bit removal unit 20a illustrated in FIG. 8 should perform.

In FIG. 10, in step S201, N=0 is set. N in this case too functions as the identifier for identifying whether or not the input of the code word is the first-time input. N=0 represents the first-time input, and N=1 represents a subsequent input after the first-time input.

In the subsequent step S202, the code word & the merging bit ($C_t$ & A) are input. In the next step S203, it is determined whether or not N=1 is established.

In step S203, in a case where the negative result is obtained as N=1 is not established, in step S204, the code word $C_t$ is held in the memory 20b (which becomes the code word $C_{t-1}$ at the next time moment). In step S205, $A_t$ is held. Then, in step S206, N=1 is set, and the flow returns to the previous step S202.

Herein, "$A_t$" represents the value of the merging bit added on the trailing edge side of the code word $C_t$, and $A_t$ held in step S205 becomes $A_{t-1}$ at the next time moment.

On the other hand, in step S203, in a case where the positive result is obtained as N=1 is established, in step S207, the value of $A_{t-1}$ is obtained, and in the subsequent step S208, it is determined whether or not $A_{t-1}=1$ is established.

In step S208, in a case where the negative result is obtained as $A_{t-1}=1$ is not established, in step S209, the code word $C_{t-1}$ is output, and the flow advances to step S211. On the other hand, in step S208, in a case where the positive result is obtained as $A_{t-1}=1$ is established, in step S210, $C_{t-1}[28]=1$ and $C_t[0]=1$ are set, and the code word $C_{t-1}$ is output.

After the processing in the relevant step S210 is performed, the flow advances to step S211.

In step S211, the code word $C_t$ is held in the memory 20b as the code word C.

Also, in the subsequent step S212, the merging bit $A_t$ is held as $A_{t-1}$.

Then, in the following step S213, it is determined whether or not a state is established where the decoding should be ended. To be more specific, in this step S213, for example, it is determined whether or not the predetermined condition that is set in advance so that the decoding processing should be ended is established such as a decoding stop instruction from the control unit whose illustration in the drawing is omitted.

In step S213, in a case where the negative result is obtained as the decoding should not be ended yet, the flow returns to the previous step S202.

On the other hand, in a case where the positive result is obtained as the decoding should be ended, the series of processings illustrated in this drawing are ended.

5. Simulation Result

Figure 11:
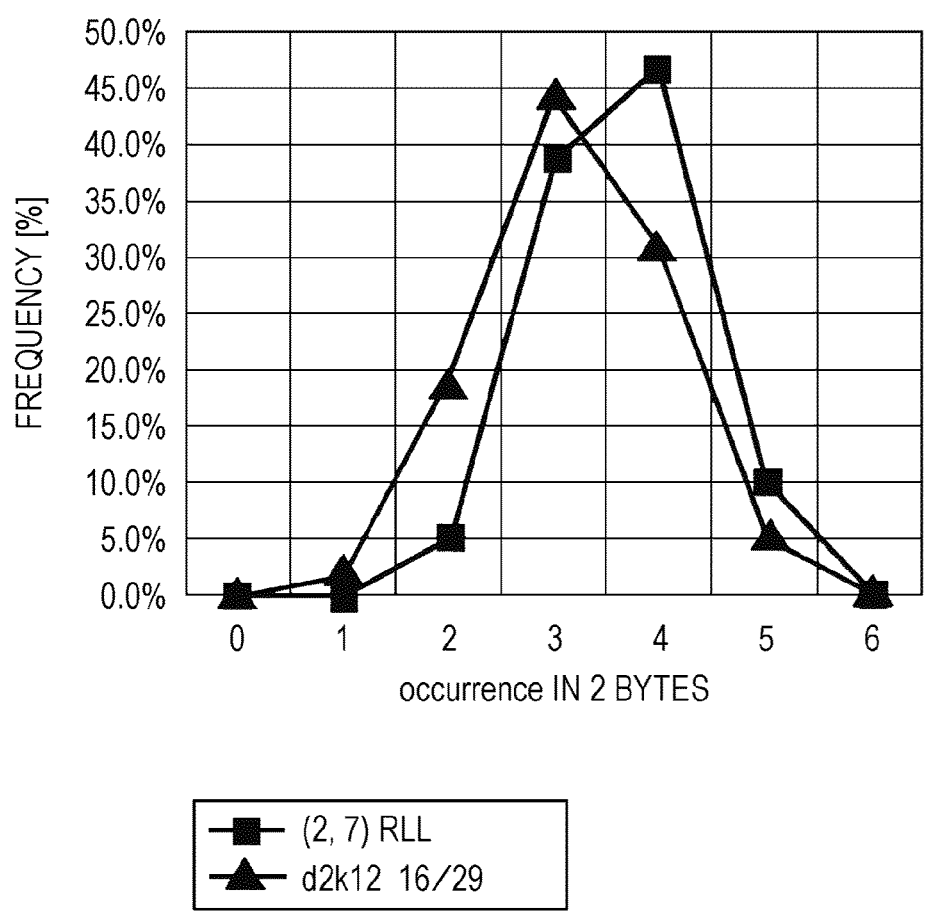
FIG. 11 illustrates a histogram of occurrence with respect to 10,000,000 code words.

FIG. 11 illustrates a histogram of occurrence with respect to 10,000,000 code words in a case where the coding according to the first embodiment is performed.

It should be noted that in this drawing, a result obtained by performing the coding according to the first embodiment (d=2, k=12, m=16, n=29, and a=1) is represented by ▲ plots, and a result obtained by performing the coding based on (2,7) RLL exemplified above is represented by ■ plots. It should be noted that in this drawing, a histogram of occurrence (herein, simply, which means the number of the symbols "1") in every 2 bytes of the code.

From the result of this FIG. 11, it can be understood that with the coding according to the first embodiment, as compared with the case of (2,7) RLL, the number of the codes having the occurrence of 4 or above is decreased and the codes can be transformed into the codes having the occurrence of 2 or 3.

From this result too, it can be understood that with the coding according to the first embodiment, the coding in which the symbols "1" are set to be sparse can be realized.

Figure 12:
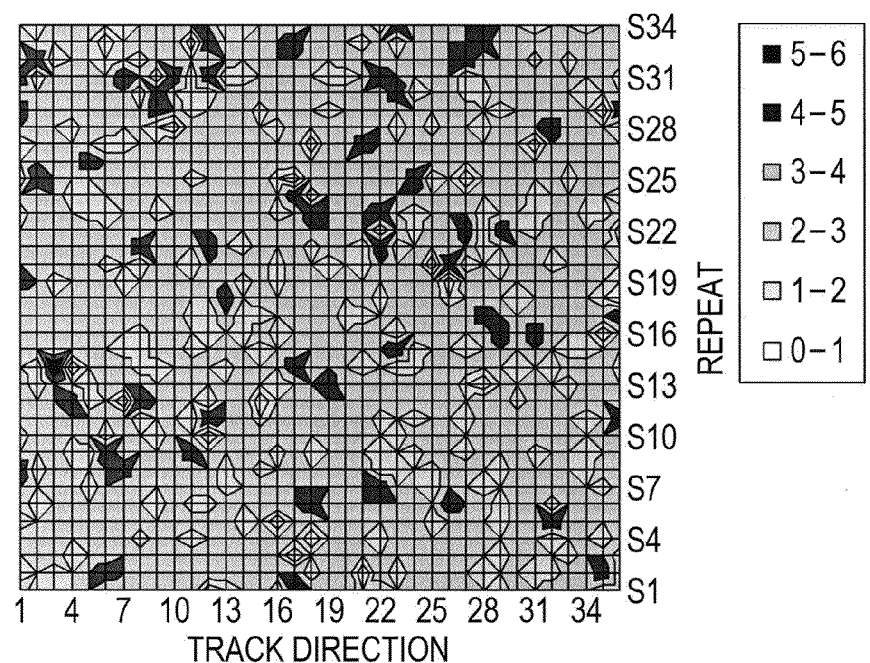
FIG. 12 illustrates a contour map of the occurrence in a case where the coding according to the first embodiment is performed.
Figure 13:
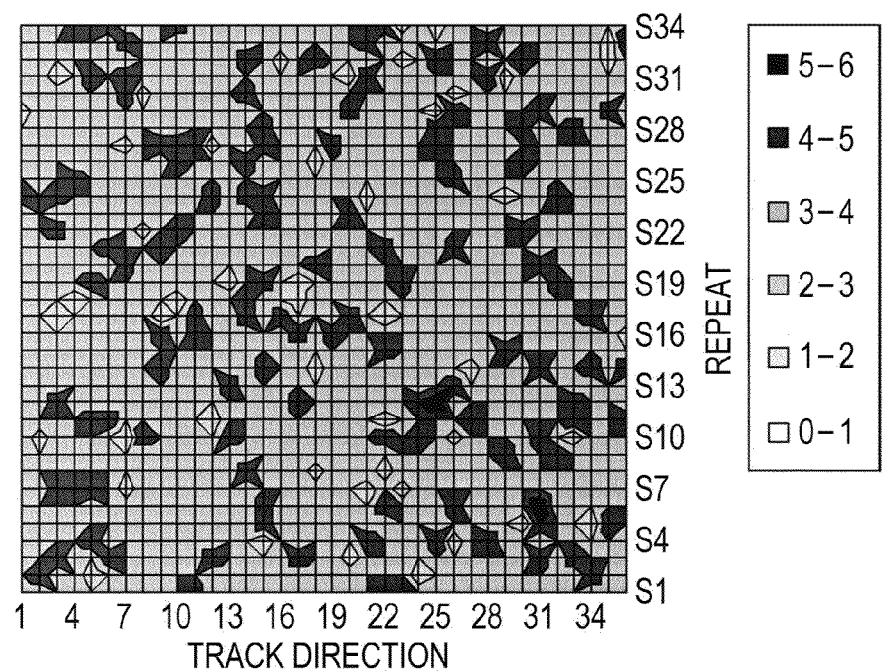
FIG. 13 illustrates a contour map of the occurrence in a case where a coding based on (2,7) RLL is performed.

Also, FIG. 12 illustrates a contour map of the occurrence in a case where the coding according to the first embodiment is performed (herein, simply, which also means the number of the symbols "1"), and FIG. 13 illustrates a contour map of the occurrence in a case where a coding based on (2,7) RLL is performed for comparison.

FIG. 12 and FIG. 13 illustrate maps where the occurrence is traced by 36 pieces from the left to the right and the tracing is sequentially performed to the next row similarly by 36 rows. The color density represents the occurrence, and it is represented that as the density is lower, the occurrence is smaller.

Also, in these FIG. 12 and FIG. 13 too, occurrence refers to the number of "1" in the 2-byte code sequence.

From the comparison between these FIG. 12 and FIG. 13 too, it can be understood that the present embodiment realizes the more sparse state.

Figure 20A:
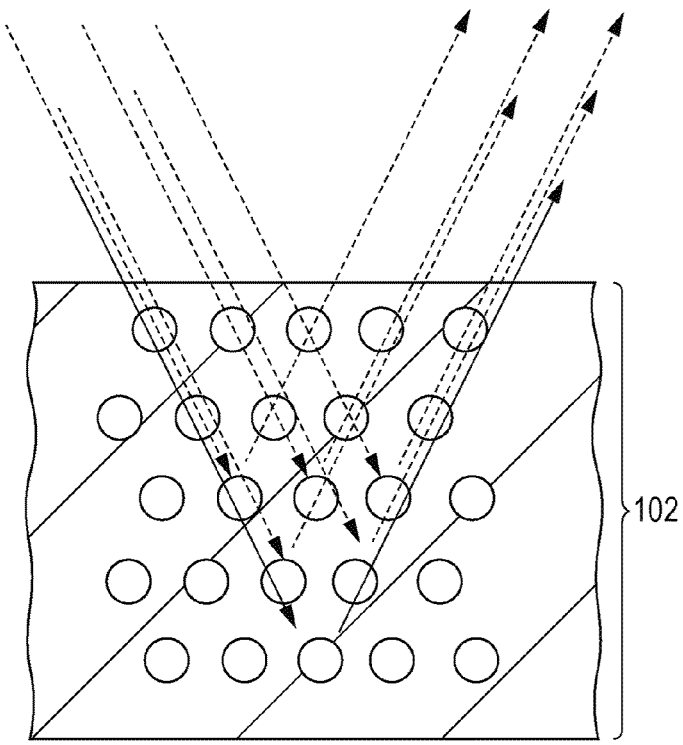
FIGS. 20A and 20B are explanatory diagrams for describing an advantage of the coding in which the number of symbols "1" is set to be sparse in the bulk-type recording medium.
Figure 20B:
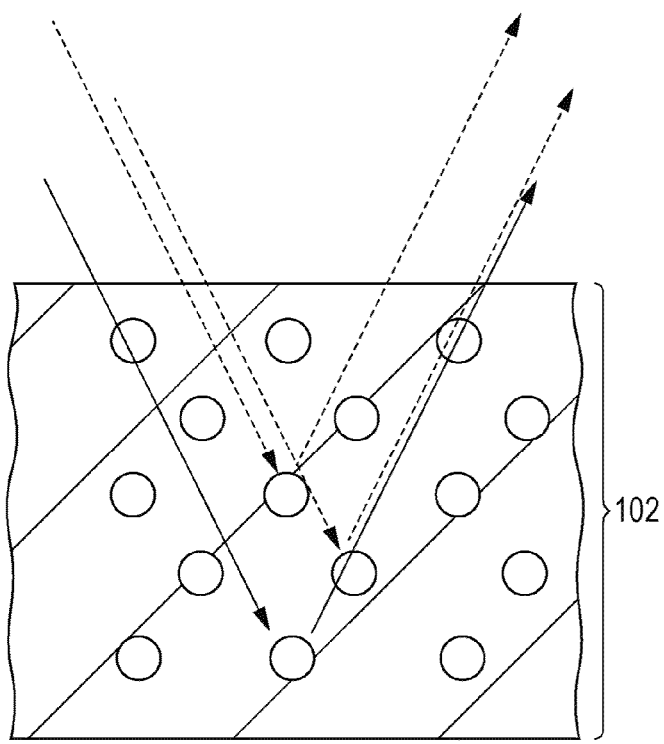

In this manner, as the sparse coding can be realized, as will be understood also from the description of FIGS. 20A and 20B above, it is possible to effectively suppress the interlayer cross talk in a case where the multilayer recording based on the bulk-type optical recording medium is performed on the mark position recording.

Second Embodiment

6. Coding According to the Second Embodiment

According to the first embodiment described above, the techniques for the coding and the decoding corresponding to the runlength constraint of d=2 are exemplified, but according to the second embodiment, techniques for a coding and a decoding corresponding to a runlength constraint of d=3 will be proposed.

Herein, in a case where the technique for performing the position recording of the marks is adopted as a premise according to the embodiment, if d=2 is set like the first embodiment described above, it may be difficult to realize the higher recording density. In other words, when d=2 is set, the minimum distance between the marks is accordingly shortened, and therefore the fusion of the marks may occur so that it may be extremely difficult to perform the appropriate recording.

In particular, in a case where the void recording system in which the hole mark is formed is adopted as the bulk recording system, it is found out that mutual voids in the shortest interval may be likely to be fused.

On the other hand, in a case where the value of d is set to be large and the shortest interval between the marks is set to be long, a window margin is narrowed, and the clock may not be appropriately reproduced in some cases.

While taking these points into account, according to the second embodiment, the example of setting d=3 will be described.

At this time, as d=3 is set, a bit number (a) of the merging bit is set as 2 instead of 1.

Also, hereinafter, as an example, a case will be described in which m=16 and n=34 are set.

Thus, the conditions set in the present example are m=16, n=34, d=3, and a=2.

In accordance with the above-mentioned premises, hereinafter, as the coding using the merging bit of a=2, a specific technique for satisfying the runlength constraints including the d=3 constraint and the predetermined k constraint will be discussed.

First, when the value $C_{t-1}[33]$="1" of the trailing edge bit in the code word $C_{t-1}$ at the previous time by one moment and also the value $C_t[0]$="1" of the leading edge bit in the code word $C_t$ at the current time are established, to satisfy at least the constraint of d=3, while both the values of $C_{t-1}[33]$ and $C_t[0]$ are changed to "0", merging bits including "1" are inserted. For example, in the present example, "10" are inserted.

In this case, to satisfy the predetermined k constraint, as the conditions that the code word of n=34 should satisfies, the following conditions are derived.

$$l' \leq k-2$$

$$r' \leq k-1$$

where l': the number of successive "0" after the first "1" of the code word starting with "1"

r': the number of successive "0" before the last "1" of the code word ending with "1"

It should be noted that for confirmation, in this case too, with regard to the respective code words (in the present example, n=34), the condition "to satisfy the predetermined runlength constraints of d and k" is of course imposed on the code words themselves.

Also, in a case other than the case where $C_{t-1}[33]$="1" and also $C_t[0]$="1" are set, while taking the insertion of the merging bits of 2 bits and the k constraint into account, an attention is paid on whether or not a sum (hereinafter, which will also be simply denoted by sum zs) of the number of successive "0" of the trailing edge section of the code word $C_{t-1}$ and the number of successive "0" of the leading edge section of the code word $C_t$ is smaller than or equal to k−2.

To be more specific, in a case where the sum zs exceeds k−2, to satisfy the k constraint, merging bits including "1" Are inserted. As described above, in the present example, as the merging bits "10" are already allocated in a case where $C_{t-1}[33]$="1" and also $C_t[0]$="1" are set, herein, "01" are inserted (it should be noted that "11" are not used because of a violation against the d constraint).

On the other hand, when the sum of the number of successive "0" of the trailing edge section of the code word $C_{t-1}$ and the number of successive "0" of the leading edge section of the code word $C_t$ is smaller than or equal to k−2, merging bits "00" are inserted.

It should be noted however that a problem at this time is that the d constraint may not be satisfied in some cases when one of $C_{t-1}[33]$ and $C_t[0]$ is "1" in a case where the sum of the number of successive "0" of the trailing edge section of the code word $C_{t-1}$ and the number of successive "0" of the leading edge section of the code word $C_t$ exceeds k−2 (in this instance, the case of inserting the merging bits "01").

For example, as a case in which the sum zs>k−2 is established, a case may also occur in which the number of successive "0" of the trailing edge section of the code word $C_{t-1}$ is k−1 and the number of successive "0" of the leading edge section of the code word $C_t$ is 0 (to elaborate, $C_t[0]$="1"). For example, in this case, as described above, if the merging bits "01" are inserted, the next bit after the merging bits "01" becomes "1", which violates the d constraint.

In a case where the merging bits "01" are inserted as described above, the above-mentioned problem of the vibration against the d constraint in the case of the sum zs>k−2 occurs when "the number of successive "0" of the trailing edge section of the code word $C_{t-1}$ is larger than or equal to 2 and also the number of successive "0" of the leading edge section of the code word $C_t$ is larger than or equal to 3".

In view of the above, to satisfy the above-mentioned restriction "the number of successive "0" of the trailing edge section of the code word $C_{t-1}$ is larger than or equal to 2 and also the number of successive "0" of the leading edge section of the code word $C_t$ is larger than or equal to 3" in the case of the sum zs>k−2 and prevent the vibration against the d constraint in the case of the sum zs>k−2, in the present example, the following restrictions are imposed with regard to the code word.

$l \leq k-3$ $r \leq k-4$ where l: the number of successive "0" on the leading edge side of the code word r: the number of successive "0" on the trailing edge side of the code word While the above-mentioned restrictions are imposed with regard to the code word, as the case where the sum zs exceeds k−2, the restriction "the number of successive "0" of the trailing edge section of the code word $C_{t-1}$ is larger than or equal to 2 and also the number of successive "0" of the leading edge section of the code word $C_t$ is larger than or equal to 3" can be typically satisfied.

As described above, to realize the coding satisfying the conditions of d=3 and a=2 and also the predetermined k constraint, the conditions that should be imposed on the code word are derived as follows.

$l \leq k-3$ $r \leq k-4$ $l' \leq k-2$ $r' \leq k-1$

Herein, when the efficiency of the coding is taken into account, it is desirable that the value of k is as small as possible.

It can be understood that the smallest k is 13 with which it is possible to construct m=16, n=34, and a=2 as the above-described conditions in the present example, that is, m/(n+a)=16/36 codes. For this reason, k=13 is set in the present example.

At this time, the number of candidates of the code words of n=34 satisfying the above-mentioned restrictions of l, r, l', and r' is 69,934.

According to the second embodiment, the transform table 11 is created by arranging $2^m=2^{16}=65,536$ pieces among these 69,934 pieces of code words in ascending order from the smaller number of "1" in the code word.

FIG. 14 and FIG. 15 illustrate a data structure of the transform table 11 according to the second embodiment.

It should be noted that in these FIG. 14 and FIG. 15 too, similarly as in FIG. 3 and FIG. 4 described above, the Data column in the drawing represents data words (HEX notation), and the Code column represents code words (binary notation). Also, the Occ column represents occurrence.

As will be understood while referring to these FIG. 14 and FIG. 15, in the transform table 11 according to the second embodiment, code words are extracted from the code words of n=34 satisfying the above-described restrictions of l, r, l', and r' (and the constrains of d and k) in ascending order from one with a smaller occurrence and associated with the code words of m=34.

Figure 16:
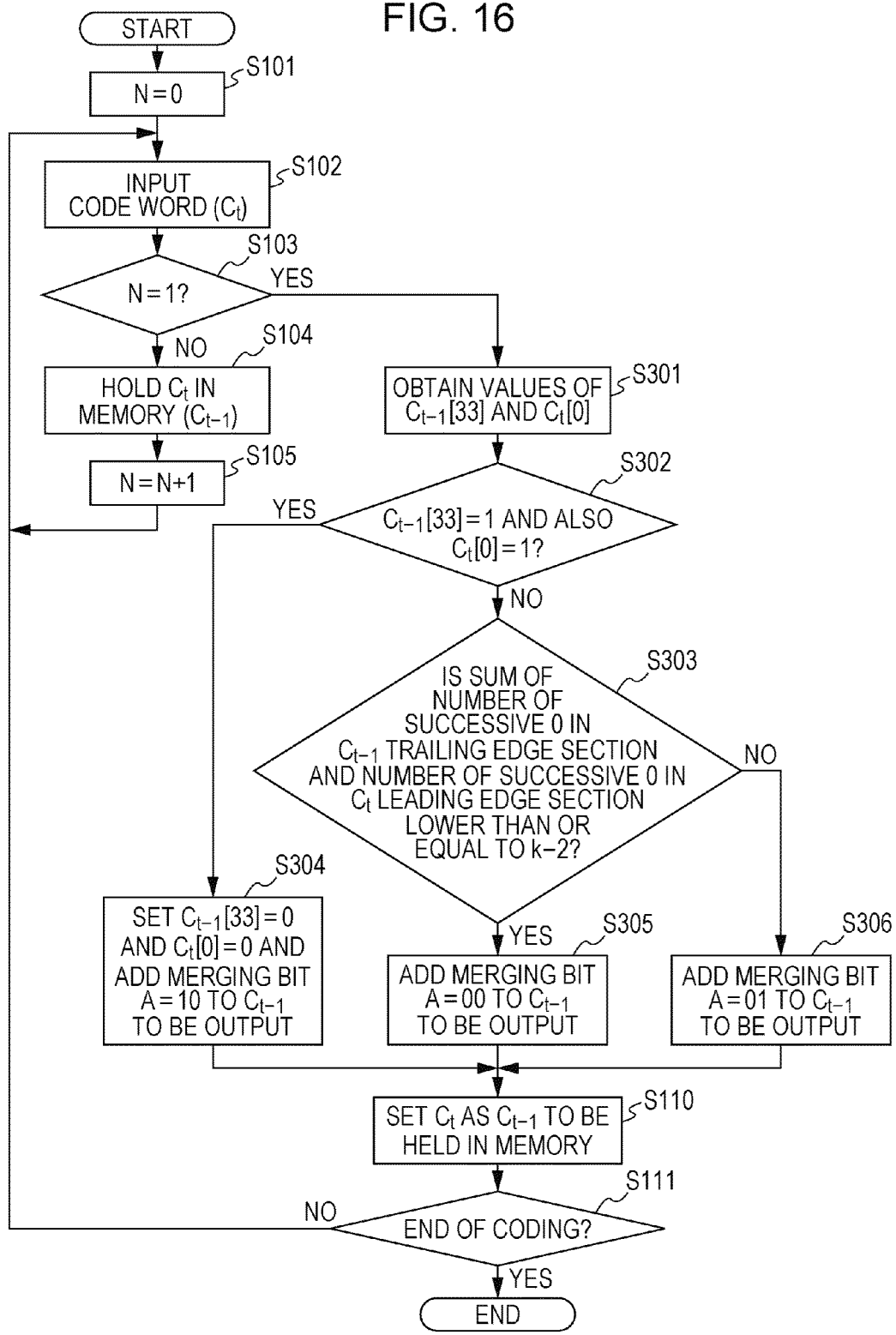
FIG. 16 is a flow chart illustrating a procedure of a specific processing that is to be performed for realizing the coding processing according to the second embodiment.

FIG. 16 is a flow chart illustrating a procedure of a specific processing that is to be performed for realizing the coding processing according to the second embodiment.

It should be noted that this FIG. 16 illustrates a specific processing procedure that is to be performed by the code word edge transform/merging bit insertion unit 10b illustrated in FIG. 5 described above.

Also, in FIG. 16, a processing similar to the processing in the case of the first embodiment illustrated in FIG. 7 described above will be assigned with the same step numbers, and a description thereof will be omitted.

As compared with FIG. 7 described above, it can be understood that in this case too, with regard to the processing in steps S101 to S105, a processing similar to the case of the first embodiment is carried out.

In the case of the second embodiment, in step S103, in a case where the positive result is obtained as N=1 is established, the flow advances to step S301, and the values of $C_{t-1}[33]$ and $C_t[0]$ are obtained.

Then, after the values of $C_{t-1}[33]$ and $C_t[0]$ are obtained, in step S302, it is determined whether or not $C_{t-1}[33]=1$ and also $C_t[0]=1$ are established.

In this step S302, in a case where the positive result is obtained as $C_{t-1}[33]=1$ and also $C_t[0]=1$ are established, the flow advances to step S304 where the change is made into [33]=0 and $C_t[0]=0$ and the code word $C_{t-1}$ is added with the merging bits A=10 to be output. After the relevant step S304 is executed, the flow advances to step S110.

On the other hand, in step S302, in a case where the negative result is obtained as $C_{t-1}[33]=1$ and also $C_t[0]=1$ are not established, the flow advances to step S303, and it is determined whether or not the sum zs of the number of successive 0 of the trailing edge section of $C_{t-1}$ and the number of successive 0 of the leading edge section of $C_t$ is smaller than or equal to k−2.

In step S303, in a case where the positive result is obtained as the sum zs is smaller than or equal to k−2, the flow advances to step S305 where $C_{t-1}$ is added with the merging bits A=00 to be output, and thereafter the flow advances to the S110.

On the other hand, in step S303, in a case where the negative result is obtained as the sum zs is not smaller than or equal to k−2, the flow advances to step S306 where $C_{t-1}$ is added with the merging bits A=01 to be output, and thereafter the flow advances to the S110.

With the content and the coding processing of the transform table 11 according to the second embodiment described above, in the case of the premise of m/(n+a)=16/36 codes, the coding can be realized in which the runlength constraints of d=3 and k=13 are satisfied and also the symbols "1" are more sparse.

7. Decoding According to the Second Embodiment

Figure 17:
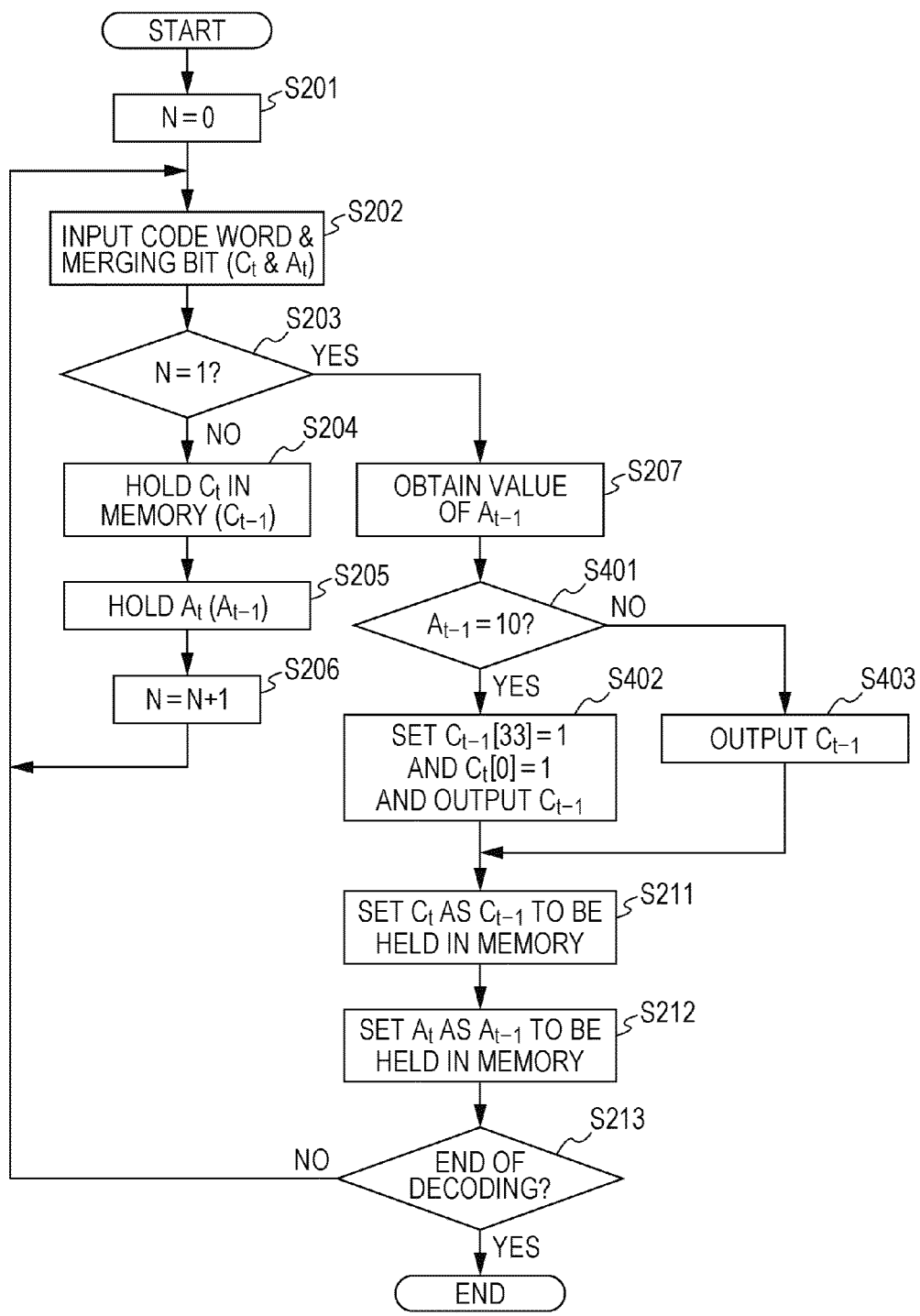
FIG. 17 is a flow chart illustrating a procedure of a specific processing that is to be performed for realizing the decoding processing according to the second embodiment.
Figure 18:
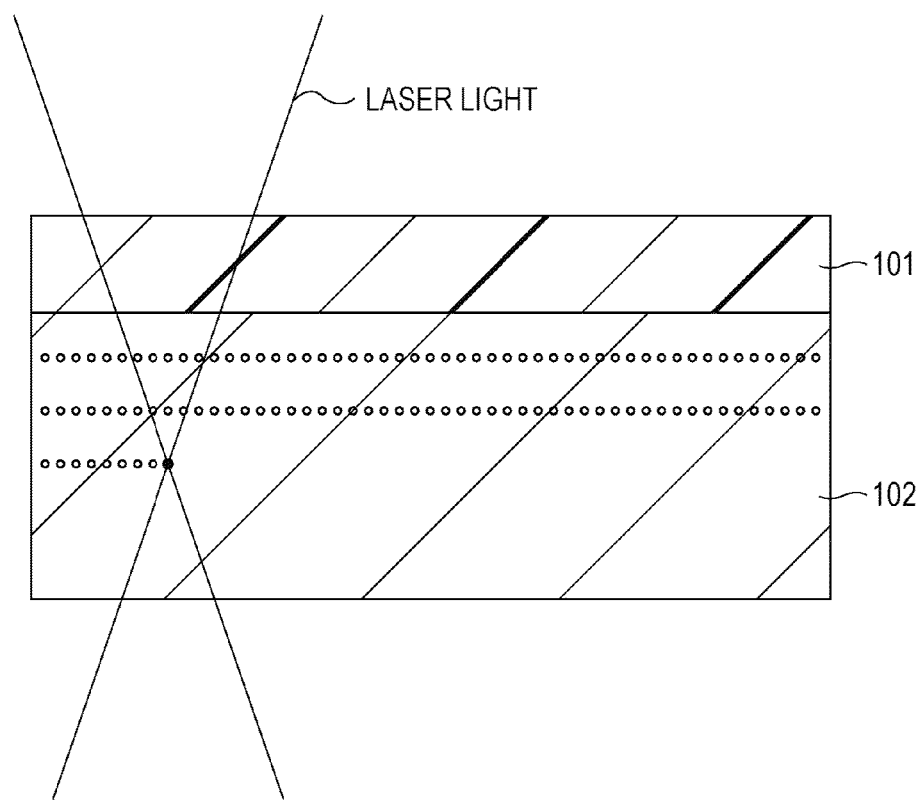
FIG. 18 is an explanatory diagram for describing a bulk recording system.

FIG. 17 is a flow chart illustrating a procedure of a specific processing that is to be performed for realizing the decoding processing according to the second embodiment while corresponding to the coding according to the second embodiment described above.

It should be noted that this FIG. 17 illustrates a specific processing procedure that the merging bit removal unit 20a illustrated in FIG. 8 should perform.

Also, in FIG. 17, a processing similar to the processing in the case of the first embodiment illustrated in FIG. 10 described above will be assigned with the same step numbers, and a description thereof will be omitted.

In FIG. 17, in this case too, for the processing in steps S201 to S207, a processing similar to the case of the first embodiment illustrated in FIG. 10 is carried out.

In the case of the second embodiment, in step S207, after the value of the merging bit $A_{t-1}$ is obtained, the flow advances to step S401.

In step S401, it is determined whether or not $A_{t-1}=10$ is established.

In this step S401, in a case where the negative result is obtained as $A_{t-1}=10$ is not established, the flow advances to step S403 where the code word $C_{t-1}$ is output, and the flow advances to step S211.

On the other hand, in step S401, in a case where the positive result is obtained as $A_{t-1}=10$ is established, in step S402, $C_{t-1}[33]=1$ and $C_t[0]=1$ are set, and the code word $C_{t-1}$ is output.

After the processing in the relevant step S402 is performed, the flow advances to step S211.

With the decoding processing described above according to the second embodiment, the above-mentioned recording code sequence obtained through the above-described coding processing according to the second embodiment can be appropriately decoded.

8. Modified Example

In the above, the embodiments of the present invention have been described, but the present invention should not be limited to the specific examples described thus far.

For example, in the above description, the transform table stores the $2^m$ pieces of code words selected in ascending order from a smaller occurrence among the code word set satisfying the selection condition derived from the runlength constraints based on d and k. However, the code words to be stored in the transform table may not be selected in ascending order from the smaller occurrence, and one or a plurality of code words having a large occurrence may also be included.

Herein, as the gist of the present invention, the coding in which the symbols "1" are sparse as a whole may be realized. From this point, the transform table may store the $2^m$ pieces of code words while being associated with data words selected to have a tendency that the number of symbols "1" is small.

Also, in the above description, the case has been exemplified in which the runlength constraints are set as d=2 and also k=12 or d=3 and also k=13, but the values of d and k should not be limited to these values. Of course, the present invention can also be suitably applied to a case in which the runlength constraints are set as other d and k.

Also, in the above description, on the premise of the coding technique for inserting the merging bit, the transform table may store the code word starting with "1" and the code word ending with "1". However, in a case where the minimum runlength constraint of d≧2 is satisfied instead of using the merging bit, the transform table is adapted to store code words at least except for the code word starting with "1" and the code word ending with "1".

It should be noted however that the use of the merging bit is of course more advantageous in terms of the coding rate.

Also, in the above description, while taking the runlength constraints into account, the transform table 11 stores the code word set selected to satisfy the runlength constraints. However, for example, in a case where the recording density is relatively low and it is beneficial not to provide the runlength constraints, etc., the code words having a small occurrence can also simply be selected from all the $2^n$ pieces of code words to be stored in the transform table.

Also, the coding rate should not be limited to the previously exemplified coding rate, and the coding rate that is suitable in accordance with the actual embodiment may appropriately be set.

In the embodiments of the present invention, as the relation between m and n, when a consideration is given on the case where the runlength constraints are not taken into account as described above, it suffices that at least n>m is satisfied.

Also, in the above description, the case has been exemplified in which the coding apparatus (coding method) and the recording apparatus (recording method) according to the embodiment of the present invention are applied to the recording reproduction apparatus that performs both the mark recording on the recording layer and the reproduction of the recorded mark but may also suitably applied to the recording apparatus that performs only the mark recording on the recording layer (recording dedicated apparatus) of course.

Also, in the above description, the case has been exemplified in which the decoding apparatus (decoding method) according to the embodiment of the present invention applied to the recording reproduction apparatus that performs both the mark recording on the recording layer and the reproduction of the recorded mark but may also suitably applied to the reproduction apparatus that only performs the reproduction of the recorded mark (reproduction dedicated apparatus) of course.

For confirmation, in the case of the reproduction apparatus, for the table used for the decoding, the transform table 11 used for the coding itself is not used, but a table where the association between the same data words and the code words as in the transform table 11 is used.

The present application contains subject matter related to that disclosed in Japanese Priority Patent Application JP 2010-106592 filed in the Japan Patent Office on May 6, 2010 and Japanese Priority Patent Application JP 2010-274549 filed in the Japan Patent Office on Dec. 9, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A coding apparatus comprising:
a transform table in which with regard to data words of m bits and code words of n bits where n and m are both integers and also n>m is established, $2^m$ pieces of code words selected to have a tendency that the number of symbols "1" is small among $2^n$ pieces of the code words of n bits are associated with $2^m$ pieces of the data words of m bits; and
a coding unit that encodes the input data words of m bits on the basis of the transform table.

2. The coding apparatus according to claim 1,
wherein in the transform table, the $2^m$ pieces of code words are selected among a code word set selected among the $2^n$ pieces of code words that satisfy runlength constraints of a minimum successive 0 length d where d≠0 and a maximum successive 0 length k where k>d.

3. The coding apparatus according to claim 2,
wherein the coding unit inserts "a" pieces of merger bits where a is an integer larger than or equal to 1 between two code words which are successive in terms of time and obtained on the basis of the transform table to satisfy the runlength constraints.

4. The coding apparatus according to claim 3,
wherein the transform table stores code words that satisfy conditions where the number of symbols "0" in a section beginning with the symbol "1" and ending with the next symbol "1" is smaller than or equal to (k−1) or the number of the successive symbols "0" of a leading edge is smaller than or equal to ((k/2)−1)) and also the number of the successive symbols "0" of a trailing edge is smaller than or equal to k/2 or the number of the symbols "0" in a section ending with the symbol "1" and the previous symbol "1" is smaller than or equal to (k−1) among the code word set satisfying the runlength constraints among the $2^n$ pieces of the code words of n bits, and also a=1 is established, and
wherein the coding unit determines whether or not a value of a trailing edge bit of a code word obtained by transforming an input data word at a previous time by one moment on the basis of the transform table and a value of a leading edge bit of a code word obtained by transforming an input data word at a current time on the basis of the transform table are both "1", outputs the code word obtained by transforming the data word at the previous time by one moment and also inserts "0" as the merging bit in a case where both the values of the trailing edge bit and the leading edge bit are not "1", and changes the values of the trailing edge bit and the leading edge bit into "0" in a case where both the values of the trailing edge bit and the leading edge bit are "1", outputs the code word obtained by transforming the data word at the previous time by one moment in which the trailing edge bit is changed into "0", and also inserts "1" as the merging bit.

5. The coding apparatus according to claim 4,
wherein m=16, n=29, d=2, k=12, and a=1 are established.

6. The coding apparatus according to claim 3,
wherein d=3 and also a=2 are established,
wherein when l denotes the number of successive "0" on a leading edge side of the code word,
r denotes the number of successive "0" on a trailing edge side of the code word,
l' denotes the number of successive "0" after a first "1" of the code word starting with "1", and
r' denotes the number of successive "0" before a last "1" of the code word ending with "1",
the transform table stores code words satisfying $l \leq k-3,$ $r \leq k-4,$ $l' \leq k-2,$ and r'≤k−1 among a code word set that satisfies the runlength constraints among the $2^n$ pieces of the code word of n bits, and
wherein the coding unit determines whether or not a value of a trailing edge bit of a code word obtained by transforming an input data word at a previous time by one moment on the basis of the transform table and a value of a leading edge bit of a code word obtained by transforming an input data word at a current time on the basis of the transform table are both "1", and changes the values of the trailing edge bit and the leading edge bit into "0", outputs the code word obtained by transforming the data word at the previous time by one moment where the trailing edge bit is changed into "0", and also inserts "10" as the merging bits in a case where both the values of the trailing edge bit and the leading edge bit are "1", and also
determines whether or not a sum of the number of successive "0" of a trailing edge section of the code word obtained by transforming the data word at the previous time by one moment and the number of successive "0" of a leading edge section of the code word obtained by transforming the data word at the current time is smaller than or equal to (k−2), outputs the code word obtained by transforming the data word at the previous time by one moment and also inserts "00" as the merging bits in a case where the sum is smaller than or equal to (k−2), and outputs the code word obtained by transforming the data word at the previous time by one moment and also inserts "01" as the merging bits in a case where the sum is not smaller than or equal to (k−2).

7. The coding apparatus according to claim 6,
wherein m=16, n=34, d=3, k=13, and a=2 are established.

8. A coding method comprising the step of:
encoding, with regard to data words of m bits and code words of n bits where n and m are both integers and also n>m is established, the data words of m bits that are input on the basis of a transform table in which $2^m$ pieces of code words selected to have a tendency that the number of symbols "1" is small among $2^n$ pieces of the code words of n bits are associated with $2^m$ pieces of the data words of m bits.

9. A recording apparatus comprising:
a transform table in which with regard to data words of m bits and code words of n bits where n and m are both integers and also n>m is established, $2^m$ pieces of code words selected to have a tendency that the number of symbols "1" is small among $2^n$ pieces of the code words of n bits are associated with $2^m$ pieces of the data words of m bits;
a coding unit that encodes the input data words of m bits on the basis of the transform table; and
a recording unit that performs a recording on the basis of the code word output by the coding unit on an optical recording medium.

10. The recording apparatus according to claim 9,
wherein the recording unit performs the recording on the optical recording medium while the symbol "1" of the code word is set as a mark and a symbol "0" is set as a space.

11. The recording apparatus according to claim 10,
wherein the optical recording medium is a bulk-type optical recording medium having a bulk layer where a mark recording is selectively performed in a plurality of positions in a depth direction, and
wherein the recording unit records the mark based on void on the bulk layer.

12. A recording method comprising the steps of:
encoding, with regard to data words of m bits and code words of n bits where n and m are both integers and also n>m is established, the input data words of m bits on the basis of a transform table in which $2^m$ pieces of code words selected to have a tendency that the number of symbols "1" is small among the $2^n$ pieces of code words of n bits are associated with $2^m$ pieces of the data words of m bits; and
performing a recording on an optical recording medium on the basis of the code words output from the encoding.

13. A decoding apparatus that decodes, with regard to data words of m bits and code words of n bits where n and m are both integers and also n>m is established, a code sequence obtained through a coding for transforming the input data words of m bits on the basis of a transform table in which $2^m$ pieces of code words selected to have a tendency that the number of symbols "1" is small among the $2^n$ pieces of code words of n bits are associated with $2^m$ pieces of the data words of m bits,
the decoding apparatus comprising:
the transform table or a table in which an association between same data words and code words as those in the transform table is made as a decoding table; and
a decoding unit that outputs data corresponding to the input code sequence on the basis of the decoding table.

14. The decoding apparatus according to claim 13,
wherein the coding is performed by inserting "a" pieces of merging bits where a is an integer larger than or equal to 1 between two code words of n bits that are successive in terms of time and obtained through the transform table to satisfy runlength constraints of a minimum successive 0 length d where d≠0 and a maximum successive 0 length k where k>d, and
wherein the decoding unit transforms the code words of n bits obtained by removing the merging bits into data words on the basis of the decoding table.

15. The decoding apparatus according to claim 14,
wherein the transform table stores code words that satisfy conditions where the number of symbols "0" in a section beginning with a symbol "1" and ending with the next symbol "1" is smaller than or equal to (k−1) or the number of the successive symbols "0" of a leading edge is smaller than or equal to ((k/2)−1)) and also the number of the successive symbols "0" of a trailing edge is smaller than or equal to k/2 or the number of the symbols "0" in a section ending with the symbol "1" and the previous symbol "1" is smaller than or equal to (k−1) among a code word set satisfying the runlength constraints among the $2^n$ pieces of code words of n bits,
and also a=1 is established,
wherein the coding is performed in a manner that the values of a trailing edge bit and a leading edge bit are changed into "0" and also the code word obtained by transforming the data word at the previous time by one moment where the trailing edge bit is changed into "0" is output and also "1" is inserted as the merging bit in a case where a condition is satisfied where the value of the trailing edge bit of the code word obtained by transforming an input data word at a previous time by one moment on the basis of the transform table and the value of the leading edge bit of the code word obtained by transforming an input data word at a current time on the basis of the transform table are both "1", and the code word obtained by transforming the data word at the previous time by one moment is output and also "0" is inserted as the merging bit in a case where the condition is not satisfied, and
wherein the decoding unit determines whether or not the value of the merging bit is "1", the code words of n bits temporally before the merging bit are transformed into data words on the basis of the decoding table and output in a case where the value of the merging bit is not "1", the value of the trailing edge bit of the code words of n bits temporally before the merging bit and the value of the leading edge bit of the code words of n bits temporally after the merging bit are both transformed into "0", the code words of n bits where the trailing edge bit is transformed into "0" is transformed into data words on the basis of the decoding table and output in a case where the value of the merging bit is "1".

16. The decoding apparatus according to claim 14,
wherein d=3 and also a=2 are established,
wherein when l denotes the number of successive "0" on a leading edge side of the code word,
r denotes the number of successive "0" on a trailing edge side of the code word,
l' denotes the number of successive "0" after a first "1" of the code word starting with "1", and
r' denotes the number of successive "0" before a last "1" of the code word ending with "1",
the transform table stores code words that satisfy the runlength constraints among the $2^n$ pieces of code words of n bits and satisfy $l \leq k-3$, $r \leq k-4$, $l' \leq k-2$, and $r' \leq k-1$, wherein the coding is performed in a manner that in a case where a condition is satisfied where a value of a trailing edge bit of a code word obtained by transforming an input data word at a previous time by one moment on the basis of the transform table and a value of a leading edge bit of a code word obtained by transforming an input data word at a current time on the basis of the transform table are both "1", the values of the trailing edge bit and the leading edge bit are changed into "0", the code word obtained by transforming the data word at the previous time by one moment where the trailing edge bit is changed into "0" is output, and also "10" are inserted as the merging bits, and in a case where a condition is satisfied in which a sum of the number of successive "0" of a trailing edge section of the code word obtained by transforming the data word at the previous time by one moment and the number of successive "0" of a leading edge section of the code word obtained by transforming the data word at the current time is smaller than or equal to (k−2), the code word obtained by transforming the data word at the previous time by one moment is output and also "00" are inserted as the merging bits, and in a case where the condition is not satisfied in which the sum is smaller than or equal to (k−2), the code word obtained by transforming the data word at the previous time by one moment is output and also "01" are inserted as the merging bits, and wherein the decoding unit determines whether or not the values of the merging bits are "10", transforms the value of the trailing edge bit of the code words of n bits temporally before the merging bits and the value of the leading edge bit of the code words of n bits temporally after the merging bits into both "0" and transforms the code words of n bits where the trailing edge bit is transformed into "0" into data words on the basis of the decoding table to be output in a case where the values of the merging bits are "10", and transforms the code words of n bits temporally before the merging bits into data words on the basis of the decoding table to be output in a case where the values of the merging bits are not "10".

17. A decoding method for decoding, with regard to data words of m bits and code words of n bits where n and m are both integers and also n>m is established, a code sequence obtained through a coding for transforming the input data words of m bits on the basis of a transform table in which $2^m$ pieces of code words selected to have a tendency that the number of symbols "1" is small among $2^n$ pieces of the code words of n bits are associated with $2^m$ pieces of the data words of m bit, the decoding method comprising the step of:

outputting data corresponding to the input code sequence on the basis of a decoding table that is the transform table or a table in which an association between same data words and code words as those in the transform table is made.

* * * * *